(12) United States Patent
Norsworthy et al.

(10) Patent No.: US 7,924,937 B2
(45) Date of Patent: *Apr. 12, 2011

(54) RESONANT POWER CONVERTER FOR RADIO FREQUENCY TRANSMISSION AND METHOD

(75) Inventors: Steven R. Norsworthy, Cardiff, CA (US); Ross W. Norsworthy, Largo, FL (US)

(73) Assignee: STMicroelectronics N.V., Amsterdam (NL)

( * ) Notice: Subject to any disclaimer, the term of this patent is extended or adjusted under 35 U.S.C. 154(b) by 2701 days.

This patent is subject to a terminal disclaimer.

(21) Appl. No.: 10/382,297

(22) Filed: Mar. 4, 2003

(65) Prior Publication Data

US 2004/0037363 A1 Feb. 26, 2004

Related U.S. Application Data

(60) Provisional application No. 60/361,812, filed on Mar. 4, 2002.

(51) Int. Cl.
*H04L 27/00* (2006.01)
(52) U.S. Cl. ...................................................... 375/295
(58) Field of Classification Search .................. 375/259, 375/295
See application file for complete search history.

(56) References Cited

U.S. PATENT DOCUMENTS

| | | | |
|---|---|---|---|
| 3,711,725 A | 1/1973 | Johannessen | |
| 3,881,120 A | 4/1975 | Osterwalder | |
| 4,118,677 A | 10/1978 | Weldon | |
| 4,996,495 A | 2/1991 | Birx | |
| 5,305,004 A | 4/1994 | Fattaruso | |
| 5,353,309 A | 10/1994 | Agazzi et al. | |
| 5,446,729 A * | 8/1995 | Jachowski | 370/339 |
| 5,535,356 A | 7/1996 | Kim et al. | |
| 5,701,106 A | 12/1997 | Pikkarainen et al. | |
| 5,729,230 A * | 3/1998 | Jensen et al. | 341/143 |
| 5,847,622 A * | 12/1998 | Chen | 332/103 |
| 6,181,199 B1 | 1/2001 | Camp, Jr. et al. | |
| 6,317,468 B1 * | 11/2001 | Meyer | 375/269 |

(Continued)

FOREIGN PATENT DOCUMENTS

EP 0 895 359 A2 2/1999

(Continued)

OTHER PUBLICATIONS

Rex T. Baird et al., "Linearity Enhancement of Multibit ΔΣ A/D and D/A Converters Using Data Weighted Averaging", IEEE Transactions on Circuits and Systems II: Analog and Digital Signal Processing 42(1995) December, No. 12, New York, US, pp. 753-762.

(Continued)

*Primary Examiner* — Kevin M Burd
(74) *Attorney, Agent, or Firm* — Lisa K. Jorgenson; William A. Munck

(57) ABSTRACT

A resonant power converter for ultra-efficient radio frequency transmission and associated methods. In one exemplary embodiment, the invention is digitally actuated and uses a combination of a noise-shaped encoder, a charging switch, and a high-Q resonator coupled to an output load, typically an antenna or transmission line. Energy is built up in the electric and magnetic fields of the resonator, which, in turn, delivers power to the load with very little wasted energy in the process. No active power amplifier is required. The apparatus can be used in literally any RF signal application (wireless or otherwise), including for example cellular handsets, local- or wide-area network transmitters, or even radio base-stations.

30 Claims, 16 Drawing Sheets

U.S. PATENT DOCUMENTS

| | | | |
|---|---|---|---|
| 6,321,075 | B1 | 11/2001 | Butterfield |
| 6,462,685 | B1 | 10/2002 | Korkala |
| 6,522,277 | B2 | 2/2003 | Fujimori et al. |
| 6,587,060 | B1 | 7/2003 | Abbey |
| 6,624,531 | B2 * | 9/2003 | Disser et al. ............. 307/10.1 |
| 6,658,239 | B1 * | 12/2003 | Elder et al. ............... 455/121 |
| 6,664,913 | B1 * | 12/2003 | Craven et al. ............. 341/200 |
| 6,825,784 | B1 | 11/2004 | Zhang |
| 6,839,389 | B2 | 1/2005 | Mehrnia et al. |
| 7,096,243 | B2 | 8/2006 | Van Der Valk et al. |
| 2001/0054974 | A1 * | 12/2001 | Wright .................... 341/144 |
| 2002/0025006 | A1 | 2/2002 | Mehrnia et al. |

FOREIGN PATENT DOCUMENTS

| | | |
|---|---|---|
| JP | 6037829 | 2/1994 |
| JP | 9284168 | 10/1997 |
| JP | 11017759 | 1/1999 |
| JP | 2000183749 | 6/2000 |
| JP | 2000236361 | 8/2000 |
| JP | 2000316029 | 11/2000 |
| JP | 2001127811 | 5/2001 |
| JP | 2001285960 | 10/2001 |
| JP | 2002057732 | 2/2002 |
| WO | WO9935746 | 7/1999 |
| WO | WO0038334 | 6/2000 |

OTHER PUBLICATIONS

IEEE Journal of Solid-State Circuits, vol. 33, No. 12, Dec. 1998, article entitled "An IC for Linearizing RF Power Amplifiers Using Envelope Elimination and Restoration" by David K. Su, Member IEEE, and William J. McFarland (7 pages).

2002 IEEE MTT-S Digest article entitled Generation of RF Pulsewidth Modulated Microwave Signals Using Delta-Sigma Modulation by J. Keyzer, R. Uang, Y. Sugiyama*, M. Iwamoto, I. Galton and P.M. Asbeck, University of California, San Diego, La Jolla, CA 92093-0407 (*Hitachi Metals, Ltd.) (pp. 397-400).

2001 IEEE article entitled Digital Generation of RF Signals for Wirelss Communications With Band-Pass Delta-Sigma Modulation by J. Keyzer, J. Hinrichs, A. Metzger, M. Iwamoto, I. Galton and P. Asbeck, University of California, San Diego, La Jolla, CA 92093-0407 (4 pages).

Office Action dated Apr. 22, 2008 in connection with Japanese Patent Application No. 2003-575570.

* cited by examiner

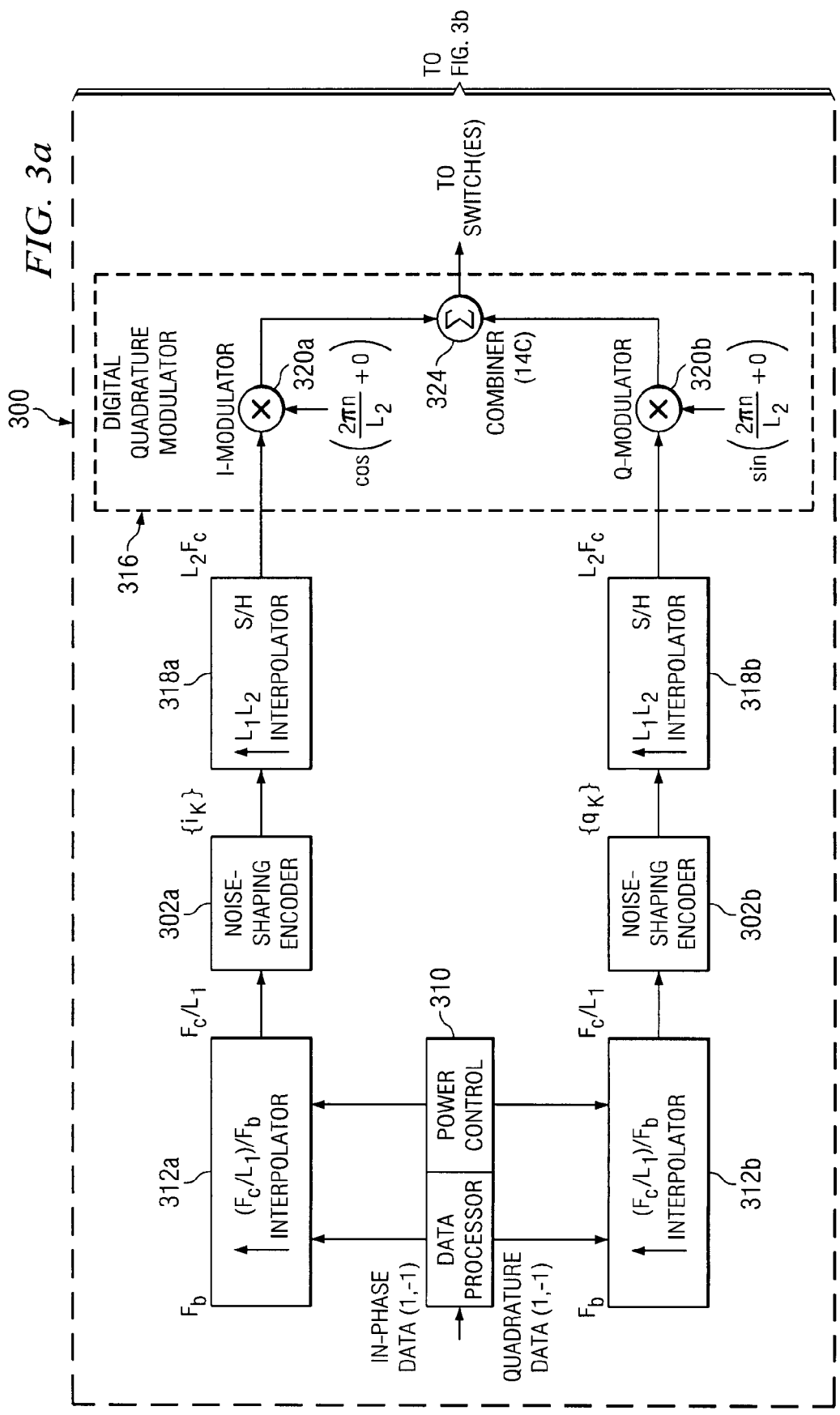

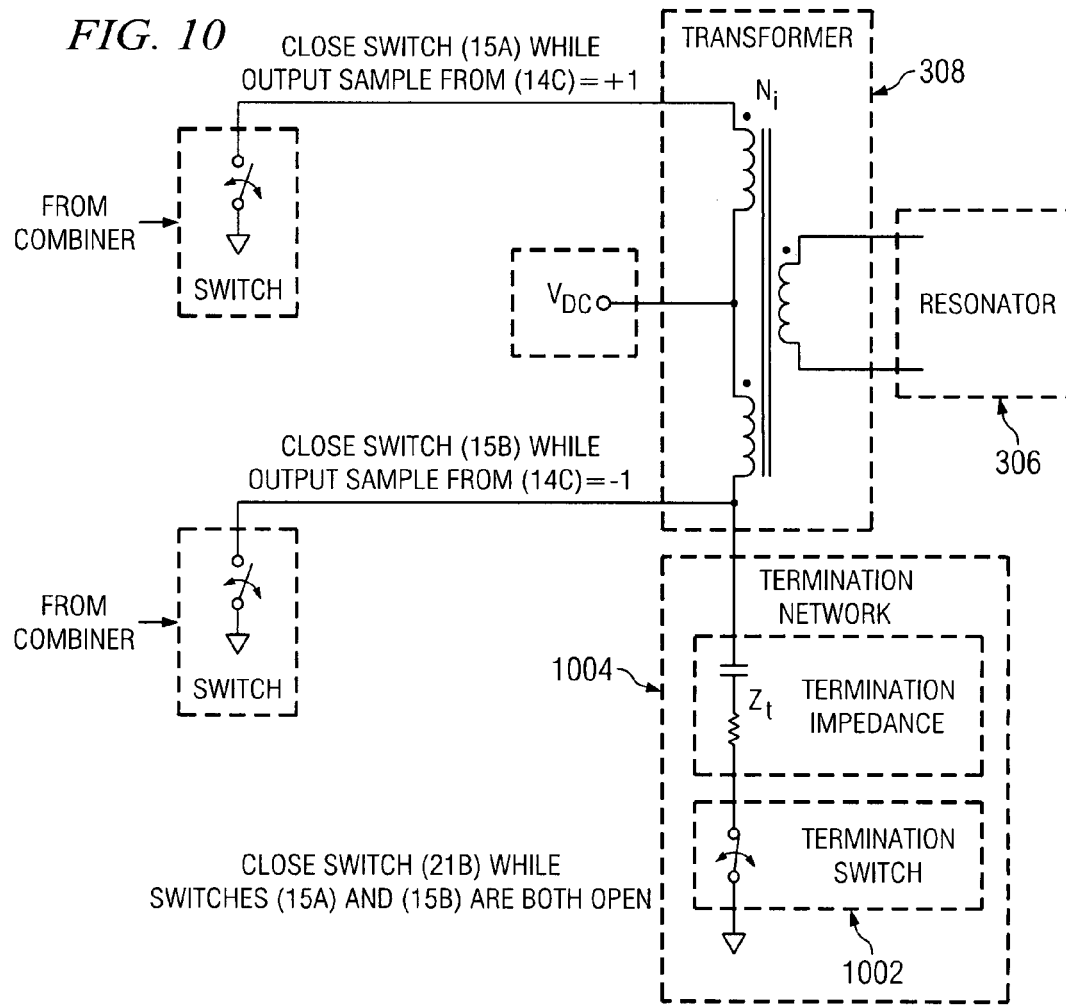

RESONANT POWER CONVERTER FOR RADIO FREQUENCY TRANSMISSION AND METHOD

PRIORITY

This application claims priority benefit of U.S. provisional patent application Ser. No. 60/361,812 entitled "RESONANT POWER CONVERTER FOR RADIO FREQUENCY TRANSMISSION AND METHOD" filed Mar. 4, 2002, which is incorporated by reference herein in its entirety.

RELATED APPLICATIONS

This application is related to co-owned and U.S. patent application Ser. No. 10/382,326 entitled "CODER APPARATUS FOR RESONANT POWER CONVERSION AND METHOD" filed contemporaneously herewith, which claims priority benefit of U.S. provisional patent application Ser. No. 60/361,813 of the same title filed Mar. 4, 2002, both of which are incorporated by reference herein in their entirety.

1. FIELD OF THE INVENTION

The present invention relates generally to radio frequency signals, and specifically to apparatus and methods for radio frequency (RF) signal transmission, reception, and/or modulation.

2. DESCRIPTION OF RELATED TECHNOLOGY

As is well understood, the so-called "PAE" (Power Added Efficiency) of an amplifier is simply the power output delivered to a load divided by the DC input power required for producing such amplification. Typically, for the exemplary CDMA cellular handset, the PAE is about 33% at the maximum transmit power level, and less than 10% on the average. Hence, if a power amplifier having a PAE of 33% puts out 1 Watt of RF power, it requires 3 Watts of DC battery power, effectively dissipating 2 Watts of heat in the process. This is obviously less than optimal usage of battery power.

Typical prior art RF transmission systems utilize methods consisting of one or more of the following steps in series: (1) modulating digital data streams independently into an in-phase and quadrature vector pair, or alternatively into an amplitude and phase vector pair; combining the vectors at some later subsequent point in the signal conversion process; (2) digitally filtering the data vectors; (3) converting the filtered vectors into analog form through D/A conversion; (4) up-converting the D/A outputs into RF signal vectors through one or more stages of modulation by an RF oscillator followed by image reject filtering for each up-conversion stage; (5) pre-amplifying (or variable gain amplifying) the output of the final up-conversion stage; (6) amplifying the preamplifier output signal with a power amplifier, wherein the amplifier is typically a Class-A or Class-AB type.

Alternatively, U.S. Pat. No. 6,181,199, to Dent, et al. entitled "Power IQ modulation systems and methods" discloses an RF transmission method which differs from the aforementioned methods in that the amplitude of the signal vectors are used to amplitude modulate the power supply of a Class-C or Class-D switching power amplifier, which also receive phase information of the signal vector as one of its inputs. U.S. Pat. No 6,198,347 to Sander, et al. entitled "Driving circuits for switch mode RF power amplifiers," describes a means of driving such an amplifier. In either of the aforementioned cases, a signal which has already been converted into the analog RF domain is amplified into a load.

U.S. Pat. No. 5,353,309 to Agazzi and Norsworthy entitled "ISDN transmitter," discloses a means of using a digital delta-sigma modulator for baseband digital telephone transmission. The delta-sigma modulator output is connected to an active analog lowpass filter, and the lowpass filter drives an active power amplifier, which in turn drives an ISDN telephone transmission line. There are no means taught in the aforesaid disclosure, however, for generating enough power to drive the line directly without the need for an active power amplifier. Also, the aforesaid disclosure does not provide any means for converting power to an RF carrier frequency, as the described system is a low frequency baseband transmission system rather than an RF passband transmission system.

U.S. Pat. No. 5,701,106 to Pikkarainen et al. entitled "Method and modulator for modulating digital signal to higher frequency analog signal" discloses a baseband digital signal in (I, Q) taken to a delta-sigma digital-to-analog converter sampled at an intermediate frequency and converted to analog for further up-conversion in the analog domain to an RF carrier frequency. No means for directly up-converting the digital baseband signal to the RF carrier frequency, nor for converting DC power directly to RF carrier power, are disclosed.

U.S. Pat. No. 6,321,075 to Butterfield entitled "Hardware-efficient transceiver with delta-sigma digital-to-analog converter" is similar to the invention of the aforementioned U.S. Pat. No. 5,701,106 inasmuch as a delta-sigma modulator in (I,Q) is taken to form an intermediate frequency and then converted to analog for further up-conversion in the analog domain to an RF carrier frequency.

FIGS. 1a-1c are illustrative of the various prior art architectures described above.

IEEE Press article number 0-7803-6540 by Keyzer et al, "Digital generation of RF Signals for Wireless Communications With Band-Pass Delta-Sigma Modulation" and incorporated by reference herein ("Keyzer"), describes a wireless transmitter incorporating bandpass delta-sigma modulation used in conjunction with a switching mode power amplifier. See also "Generation of RF Pulsewidth Modulated Microwave Signals Using Delta-Sigma Modulation" by Keyzer, et al., IEEE Publication 0-7802-7239 dated May 2002.

In full-duplex frequency-division systems such as CDMA, the transmitter and receiver can both be on simultaneously. When the transmitter is on, it typically generates noise or distortion that can fall into the receive band. Using the CDMA standards of IS-95, IS-95a, IS-98, or IS-2000 as examples, the receive band is 80 MHz offset from the transmit band. A typical power amplifier used in a CDMA handset transmitter generates a noise density of approximately −135 dBm/Hz in the receive band. For example, for the North American PCS band of operation, the receive band is 80 MHz higher than the transmit carrier frequency. In order to prevent degrading the receiver's sensitivity, the noise generated from the transmitter needs to be suppressed to a level below the thermal noise floor of the receiver. The thermal noise floor of the receiver is approximately −174 dBm/Hz. Therefore, the difference between the noise floor of the power amplifier and the thermal noise floor is greater than 40 dB. This level of noise suppression is commonly achieved through a duplexer, the construction and operation of which is well known to one of ordinary skill in the art. A duplexer is a 3-port device, with one port connected to the output of the power amplifier, another port connected to the antenna, and a third port connected to the receiver's input.

A particularly difficult problem in using noise-shaping encoders in full-duplex transceivers is that high levels of quantization noise are generated out of band, and this may even further corrupt the receive band. The Keyzer reference described above alludes to this problem, yet does not (i) recognize just how severe the problem would be using their disclosed approach, or (ii) suggest a solution to meeting the requirements in a practical system. Keyzer uses a second-order bandpass delta-sigma modulator operating at 4 times the carrier frequency, $F_c$, yet doesn't consider the noise floor in the adjacent receive band under these conditions. The assignee hereof performed a simulation for the purposes of measuring the quantization noise generated by the bandpass delta-sigma modulator of Keyzer. Conservative assumptions were made with respect to the maximum power level required in the relevant standards, and the available battery technology available in typical handsets. Based on these assumptions, a simulation model was constructed and determined that the quantization noise would be on the order of −94 dBm/Hz at the antenna, without any analog filtering or duplexer suppression. This means that in order to suppress this level of quantization noise below the thermal level of −174 dBm/Hz, more than 80 dB of filtering is required. Furthermore, 80 dB of suppression is needed not just at a single frequency, but over the entire receiver band. For the exemplary North American PCS band of CDMA, this bandwidth is 60 MHz, covering 1.93-1.99 GHz. If an analog RF filter with 80 dB of suppression over this whole frequency range existed in the current state-of-the-art, it would necessarily have a high insertion loss, and would also be comparatively expensive. Therefore, both efficiency and economy are significantly impacted using this approach. Thus, there exists a need for a more efficient and economical solution to suppressing the noise in the receiver band.

Another particularly difficult problem not addressed by the invention of Keyzer relates to the extremely high sample rate of the bandpass delta-sigma modulators. At PCS frequencies, the Keyzer scheme would require arithmetic logic circuits and registers inside the delta-sigma modulator operating at nearly 8 GHz. In a portable battery-powered PCS handset, the power consumption just for the bandpass modulator logic would be enormous in any practical semiconductor technology available at the time of this writing, an in fact any currently envisioned. Thus, there also exists a need to reduce the clock rate of the delta-sigma modulators.

A third difficult problem not addressed by Keyzer relates to the interface between the switch-mode power amplifier and the analog filter that follows. Specifically, no disclosure or teaching on how to build an operative switch mode amplifier, and efficiently "drive" it into a filter, is provided. Furthermore, no specific coupling architecture is suggested or described. Hence, a significant technological challenge is left un-addressed by Keyzer.

It is further noted that Keyzer teaches or infers nothing regarding any interpolation filters, or any specific implementation(s) of interpolation filters.

Relevant discussion on the subject of delta-sigma data conversion may be found in the textbook by Norsworthy, et al. entitled *Delta-Sigma Data Converters*, IEEE Press, 1997. In Chapter 9 (beginning on p. 282), the subject of bandpass delta-sigma modulators is addressed. Bandpass delta-sigma A/D converters have been used for intermediate frequency (IF) demodulation since the early 1990's. However, no disclosure relating to the use of delta-sigma D/A converters for radio transmission or RF power conversion is provided.

As evidenced by the foregoing, application of the fundamental concepts of delta-sigma modulation has not produced tenable solutions to the aforementioned problems. Thus, there remains a salient need for an improved apparatus and method for converting signals digitally into RF power without having to build an active amplifier, and without having to first convert a digital data signal into the analog domain at a frequency substantially less than the RF carrier frequency. Such improved apparatus and methods would also inherently provide a high degree of power efficiency to reduce power consumption and, inter alia, thereby increase the battery longevity of wireless handsets.

SUMMARY OF THE INVENTION

The present invention satisfies the aforementioned needs by providing an improved method and apparatus for signal and power conversion.

In a first aspect of the invention, an improved apparatus for resonant power conversion of RF signals is disclosed. The apparatus generally comprises a pulse input source adapted to generate a plurality of pulses; a resonator operatively coupled to the pulse input source; and a transmission medium operatively coupled to the resonator's output and adapted to transmit a plurality of RF signals. In one exemplary embodiment, the resonator has a resonant frequency at or substantially near a carrier frequency, and is further adapted to efficiently store energy (through, inter alia, selective reinforcement of at least portions of a plurality of the generated pulses) for subsequent transmission thereof. Specifically, one variant uses a digitally actuated resonant power (DARP) converter comprising a noise-shaping encoder for receiving digital data at a clock rate $F_c/L_1$, where $L_1$ is a multiple or sub-multiple of a carrier frequency $F_c$, and encoding the digital data. A power supply having a frequency at or substantially near DC is also provides, as well as a load impedance coupled to the resonator for receiving energy stored in the resonator. A charging switch is coupled to the noise-shaping encoder, power supply, resonator, and a clock having a clock rate $L_2F_c$, where $L_2$ is a multiple of the carrier frequency $F_c$. The charging switch is adapted to: (i) receive encoded data from the noise-shaping encoder; (ii) sample the voltage or current of the power supply; and (iii) deliver the power supply voltage or current samples to the resonator.

In a second aspect of the invention, an improved method for performing resonant power conversion is disclosed. The method generally comprises generating a plurality of pulses; inputting the pulses into a resonator adapted to selectively reinforce at least portions of a plurality of the pulses; selectively reinforcing the aforementioned portions of the pulses; and transmitting the selectively reinforced signals over a transmission medium.

In a third aspect of the invention, an improved transfer function for noise-shaping encoder implementation is disclosed which allows the function to be implemented with two lowpass encoders operating at a lower sampling rate.

In a fourth aspect of the invention, an improved noise-shaping encoder apparatus is disclosed. In one exemplary embodiment, the improved encoder apparatus comprises a table lookup and data-addressable memory.

In a fifth aspect of the invention, improved methods and apparatus for controlling power gain of the apparatus are disclosed. In one exemplary embodiment, power gain is controlled completely in the digital domain. In a second embodiment, gain is controlled by a combination of digital and analog means.

In a sixth aspect of the invention, an improved charging switch apparatus is disclosed. In one exemplary embodiment, charging switches are implemented on the same semiconductor substrate as the noise-shaping encoder logic in a manner that significantly reduces power consumption.

In a seventh aspect of the invention, an improved resonator and transformer combination is disclosed, including improved dynamic impedance termination.

In an eighth aspect of the invention, an improved resonator apparatus is disclosed, wherein the resonator is combined as part of a duplexer.

BRIEF DESCRIPTION OF THE DRAWINGS

The features, objectives, and advantages of the invention will become apparent from the detailed description set forth below when taken in conjunction with the drawings, wherein:

FIG. 10 is a functional block diagram of an alternate embodiment of the apparatus of FIG. 2, illustrating an exemplary configuration of a termination network on the switch side of the resonator.

FIG. 11 is a functional block diagram of an alternate embodiment of the apparatus of FIG. 2, illustrating an exemplary scheme for incorporating the resonator into a duplexer.

DETAILED DESCRIPTION OF THE INVENTION

Reference is now made to the drawings wherein like numerals refer to like parts throughout.

As used herein, the terms "transmit", "transmission" and "transmitting" for convenience may generally be considered to refer to both the acts of transmitting signals and receiving signals, as applicable.

As used herein the terms "memory" and "storage device" are meant to include any means for storing data or information, including, without limitation, RAM (e.g., SRAM, SDRAM, DRAM, SDRAM, EDR-DRAM, DDR), ROM (e.g., PROM, EPROM, EEPROM, UV-EPROM), magnetic bubble memory, optical memory, embedded flash memory, etc.

It will be recognized that while the following discussion is cast primarily in terms of a wireless RF handset (e.g., cellular telephones), the present invention is in no way limited to any particular wireless method, air interface, or architecture, or for that matter wireless applications. The invention may be applied with equal success to non-wireless systems of any kind as well, consistent with any limitations described herein.

Figure 1A:
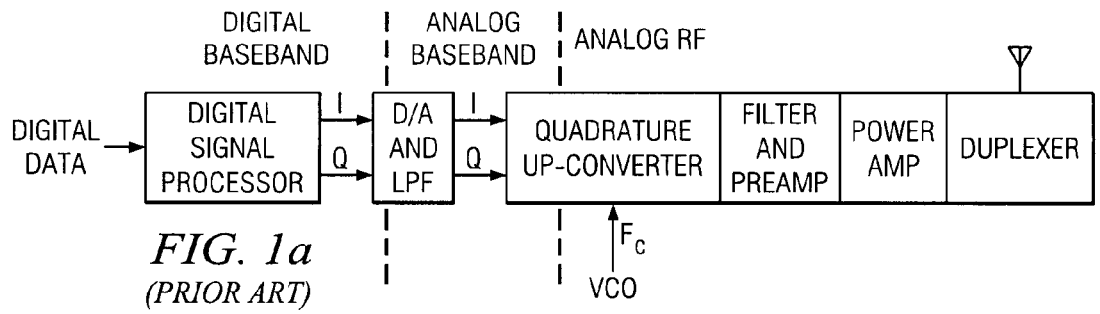
FIGS. 1a, 1b, and 1c are functional block diagrams illustrating the general configuration of typical prior art RF transmitter and power amplification systems.
Figure 1B:
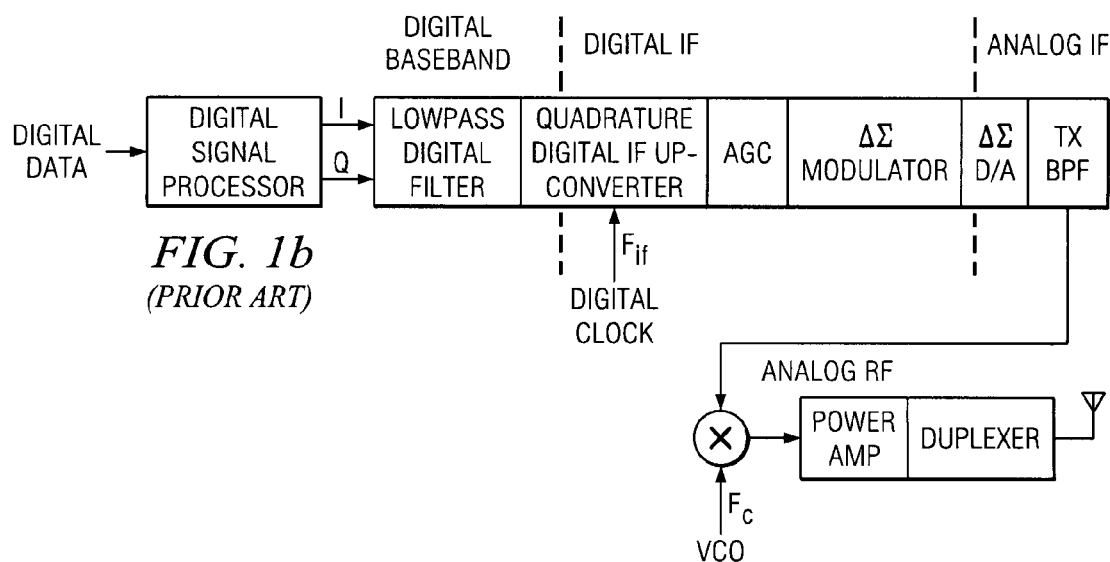
Figure 1C:
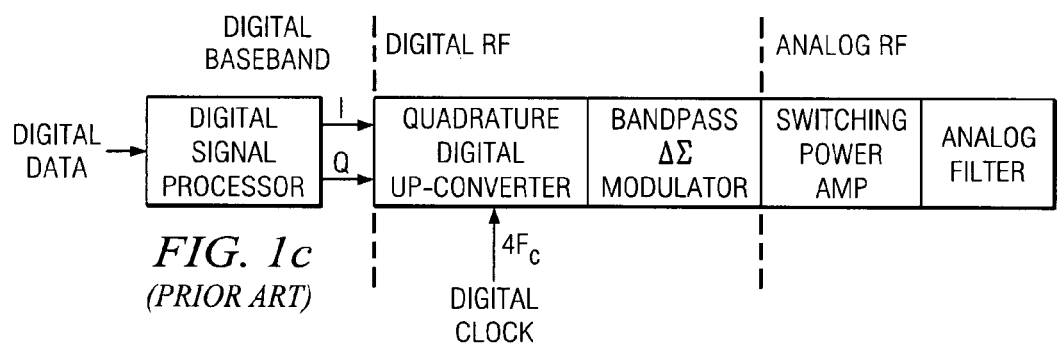
Figure 2:
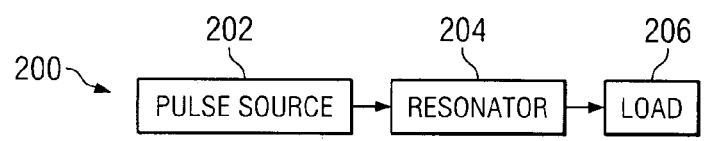
FIG. 2 is a functional block diagram illustrating the general configuration of an exemplary converter apparatus according to the present invention.
Figure 2A:
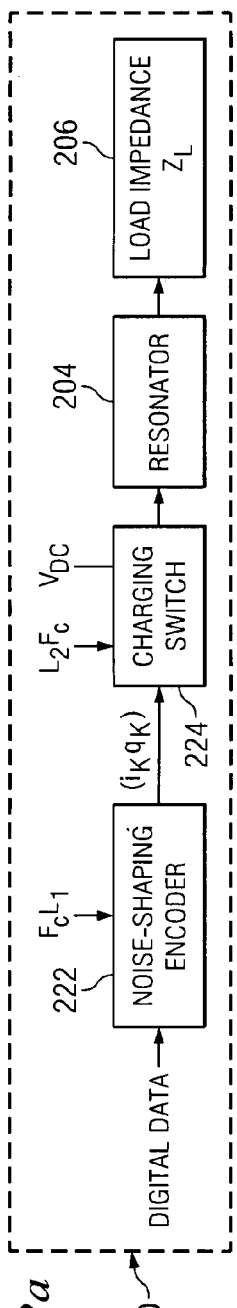
FIG. 2a is a functional block diagram illustrating an exemplary configuration of the converter apparatus of FIG. 2.

Referring now to FIGS. 2 and 2a, an exemplary generalized form of the resonant power converter of the present invention is described. As shown in FIG. 2, the apparatus 200 of the invention can be generally thought of as a pulse input source 202 whose output is coupled to the input of a resonator 204, the output of the resonator coupled to a load or transmission means (e.g., wireless antenna, transmission line, etc.) 206. The particular properties of the resonator of the invention are described in greater detail subsequently herein. One highly advantageous attribute of the configuration of FIG. 2 (and in fact, all other disclosed embodiments of the invention) is that no amplifier whatsoever is needed; rather, the resonator 204 acts effectively as an ultra-high efficiency power supply. This not only obviates the cost, complexity, etc. associated with prior art designs having a power amplifier, but also provides significantly increased efficiency, thereby having great impact on, inter alia, the power consumption of RF devices.

FIG. 2a illustrates an exemplary digitally actuated resonant power (DARP) device 220 based on the generalized model of FIG. 2. This device 220 includes a noise shaping encoder 222 and charging switch 224 as part of the pulse data source 202 of FIG. 2.

Figure 3B:
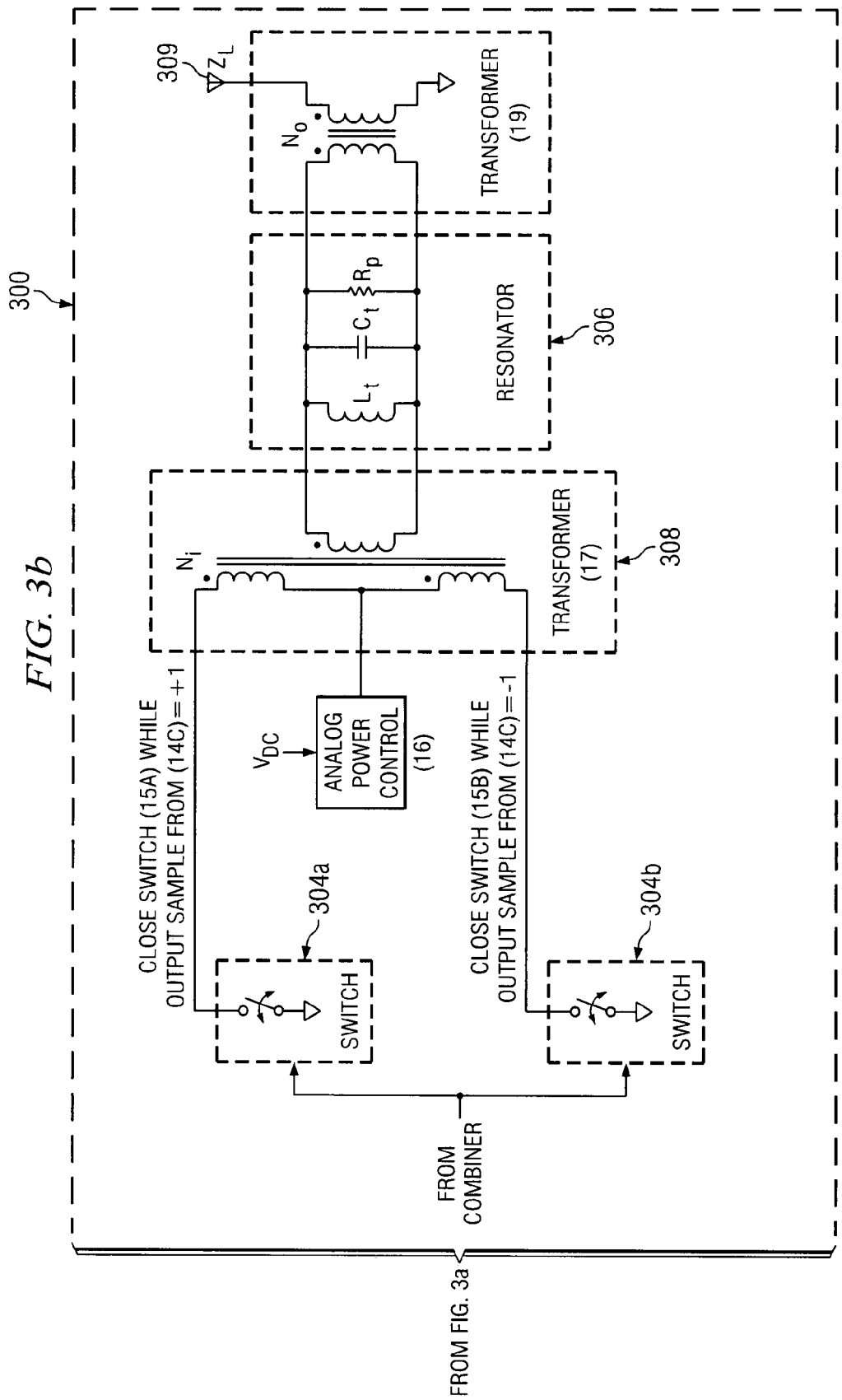
FIG. 3 is a functional block diagram illustrating one exemplary embodiment of the converter apparatus of FIG. 2.

Referring now to FIG. 3, one exemplary architecture 300 (based on that of FIG. 2 discussed above) assumes that digital data is to be passband modulated, and then transmitted at radio frequencies to a load impedance, such as an antenna or transmission line. Digital data is coupled to one or more noise-shaping encoders 302 that spectrally shape quantization noise, pushing the noise out of the band of interest. The output of the noise-shaping encoder 302 is typically one or a few bits wide, and the output word rate of the encoder is typically a multiple or sub-multiple $L_1$ of the RF carrier frequency $F_c$. The output of the encoder 302 is coupled to at least one charging switch 304. Such charging switch(es) may comprise any number of different configurations well known to those of ordinary skill in the electronic arts, as discussed in greater detail below. The purpose of the charging switch 304 is to sample a DC power supply voltage VDC (or alternate low frequency power supply) and rapidly (e.g., instantaneously) switch charge onto the internal capacitance of the resonator 306, at either the positive phase of the RF carrier frequency $F_c$, or at the anti-phase of $F_c$ 180 electrical degrees later. A moment after the resonator's capacitance is charged, current begins to flow through the inductance of the resonator, and the resonator begins to oscillate at $F_c$. The resonator 306 is in the illustrated embodiment assumed to be a high-Q resonator to effectively multiply the load impedance $Z_L$ 309 at the output of the resonator 306, as seen by the input to the resonator. The load impedance 309 may either be an antenna, transmission line, or other similar modality, although other forms of impedance may also be substituted. The charging switch(es) 304 continues to actuate the resonator at either the positive phase or antiphase of $F_c$. The output samples $\{i_k, q_k\}$ of the noise-shaping encoder(s) 302 determine the value of the charging switch samples at each sampling instant.

The noise-shaping encoder 302 may either be implemented as two lowpass encoders (FIG. 3), as a single bandpass encoder 406 (FIG. 4), or in other equivalent configurations. In applications where power consumption is a major concern and where the clock frequencies are near the upper limit of the "available" semiconductor technology (here, "available" meaning available limited by the state of the art, or alternatively limited by other constraints such as target cost, IC operating voltage, die size, etc.), there may be a significant advantage in implementing the noise-shaping encoder as two lowpass encoders at a lower clock frequency, as opposed to a bandpass encoder at a higher clock frequency.

The noise-shaping encoder function of the present invention may alternatively be implemented as a table lookup function, where the noise-shaping encoding is performed for example off-line in advance of the known finite states of the digital data. For example, the results may be stored in a data addressable memory or storage device for convenience. Myriad other options exist. Such configurations and options will be readily recognized and understood by those of ordinary skill in the signal processing arts, and accordingly are not described further herein.

Figure 4:
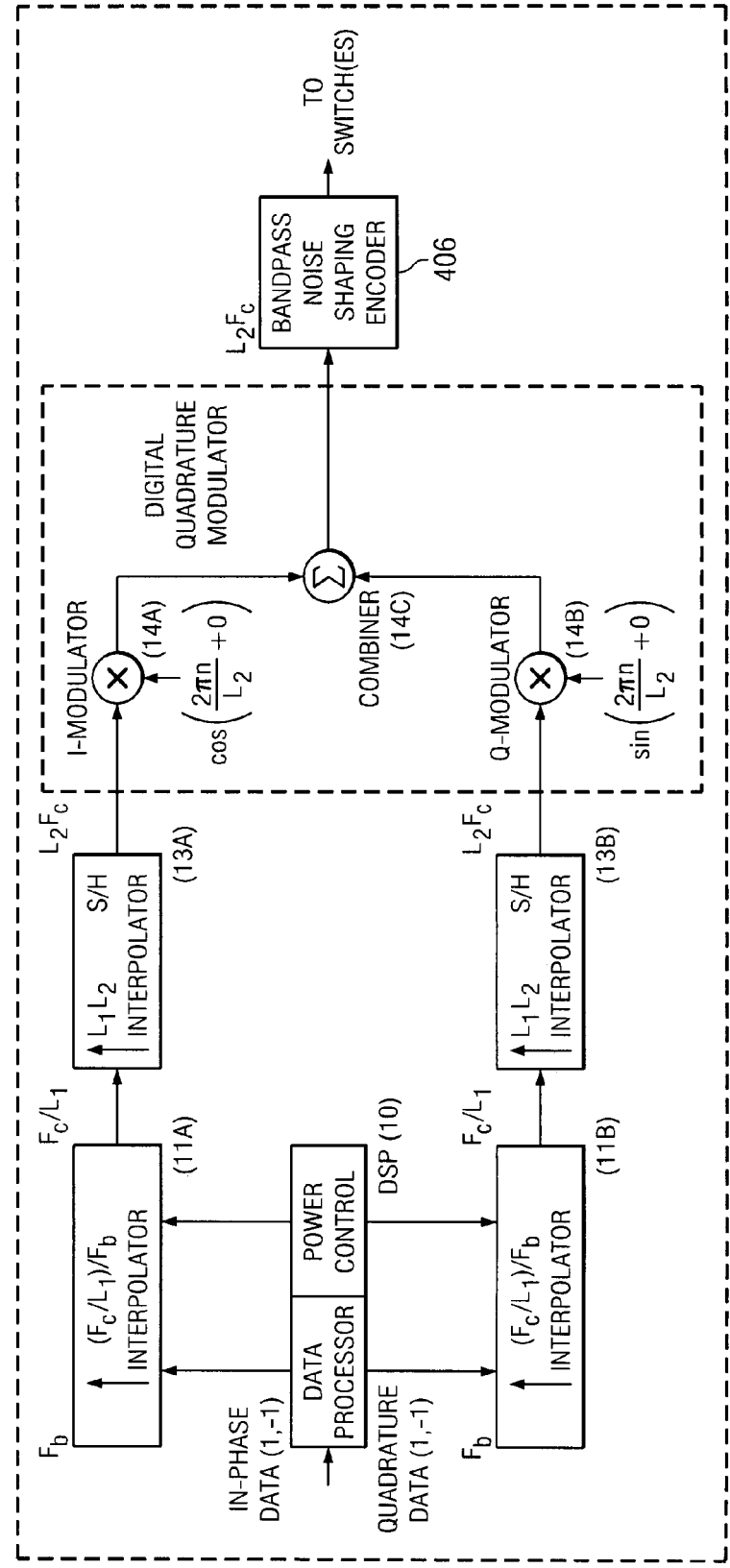
FIG. 4 is a functional block diagram illustrating another exemplary embodiment of the converter apparatus of FIG. 2.

The embodiments of FIGS. 3 and 4 are now described in greater detail. Beginning with a digital processor 310 (which may comprise a DSP, RISC processor, CISC processor, ASIC, or the like having sufficient capability), a digital data stream is separated into two orthogonal signal vectors: an in-phase vector (I) and a quadrature vector (Q), at a symbol rate of $F_b$. The digital data can be one of any type of known modulation formats including, without limitation, shift keying (e.g., π/4 QPSK, FSK, GFSK, GMSK, etc.), amplitude modulation (e.g., QAM, etc.), and the like. The binary data is treated as a 1 for the "one" state and a −1 for the "zero" state, although it will be recognized that these designations are arbitrary. Digital interpolation filters 312 provide channel filtering on the symbols, and can be one of any type of known symbol filters, such as the family of raised cosine filters that provide zero intersymbol interference. For many specific data transmission standards, such as IS-2000, the symbol filtering is specified. In any case, the symbol filtering can be incorporated within the overall filtering performed by digital interpolation filters 312. The filters 312 also increase the sampling rate by the ratio $(F_c/L_1)/F_b$, where $F_c$ is the carrier frequency of the desired RF signal to be transmitted. In the exemplary embodiment, $L_1=1$, which simply means that the lowpass noise-shaping encoders 302 are operating at a sampling rate equal to the carrier frequency, $F_c$. In order to lower the power consumption of the encoder logic 302, it may be desirable to lower the sampling rate of the encoders (12), therefore, $L_1=2$, or even larger, could be chosen, at the sacrifice of greater quantization noise in the desired bands of interest. In practice, the overall interpolation ratio $(F_c/L_1)/F_b$ will typically still be a large number. By way of example for the IS-2000 standard, if the symbol rate $F_b$ is 1.23 MHz and if the carrier frequency $F_c$ is 1.88 GHz, and if $L_1=1$, then the overall interpolation ratio is approximately equal to 1529.945. Obviously, other frequencies may be selected, resulting in other interpolation ratios. In general, the interpolation ratio between the carrier rate and the symbol rate will not necessary be an integer, and the baseband symbol clock may come from a completely independent (incommensurate) source with respect to the carrier clock. It will be appreciated that various compatible techniques exist at the time of this writing for carrying out fractional sample rate conversion, including but not limited to, fractional-N synthesis phaselock loops. An all-digital technique employing fractional decimation and interpolation may also be employed, appropriate with the scope and architecture of this invention. The reader is referred to, for example, "Sample Rate Conversion for Software Radio" by Hentschel et al., IEEE Communications Magazine, Aug. 2000, p.142-150, incorporated herein by reference. Many other well known techniques for synchronizing asynchronous clocks may be applied to this invention by one with ordinary skill in the art given the present disclosure.

The digital interpolation filters 312 of FIG. 3 may actually be used to distribute the interpolation ratio $(F_c/L_1)/F_b$ across two or more stages of interpolation for the purpose of reducing the cost and power consumption of the implementation by relaxing the multiplication rates and complexity. The design of multi-rate digital filters is well known in the literature, and such techniques applied to delta-sigma converters are also well known in the art, and may be found, e.g., in Chapter 13 of the aforementioned textbook by Norsworthy, et al., *Delta-Sigma Data Converters*, IEEE Press, 1997, incorporated herein by reference. For example, consider a symbol-rate filter for IS-2000, and let the overall interpolation filter be divided into three main sections. Let the first filter, operating on the incoming symbols, have the following constraints: an FIR structure; operating at 8 times the symbol rate; passband cutoff frequency of 0.48 times the symbol rate; passband ripple of less than 1 dB; stopband cutoff frequency of 0.6 times the symbol rate; stopband attenuation of least 60 dB. These constraints will result in an FIR filter having at least 160 taps, found by using the well-known Remez exchange algorithm. The second stage of interpolation filtering may be a sinc-cubic filter having an oversampling ratio of 24, producing images at multiples of 8 times the symbol rate that are suppressed by at least 70 dB. A third stage of interpolation filtering may simply be a zero-order hold, having an oversampling ratio equal to 8, producing images at multiples of 8*24=192 times the symbol rate that are suppressed by at least 50 dB. Thus, if we multiply the oversampling ratios of all three of these filter stages, we have 8*24*8=1536, and the overall oversampling ratio $(F_c/L_1)/F_b$ is achieved efficiently.

A fractional sampling rate converter may be incorporated within one or more stages of interpolation, in order to synchronize the baseband symbol rate to the carrier rate. It will be appreciated that while this example embodiment describes one efficient way of achieving the interpolation filters 312, there are certainly other substitutions that can be recognized and made by one of ordinary skill in the art, such as but not limited to, substituting IIR filters for FIR filters, making more stages or fewer stages of interpolation filtering, choosing different relative interpolation ratios, choosing a larger value of $L_1$ in order to lower the interpolation ratio, etc.

Figure 5:
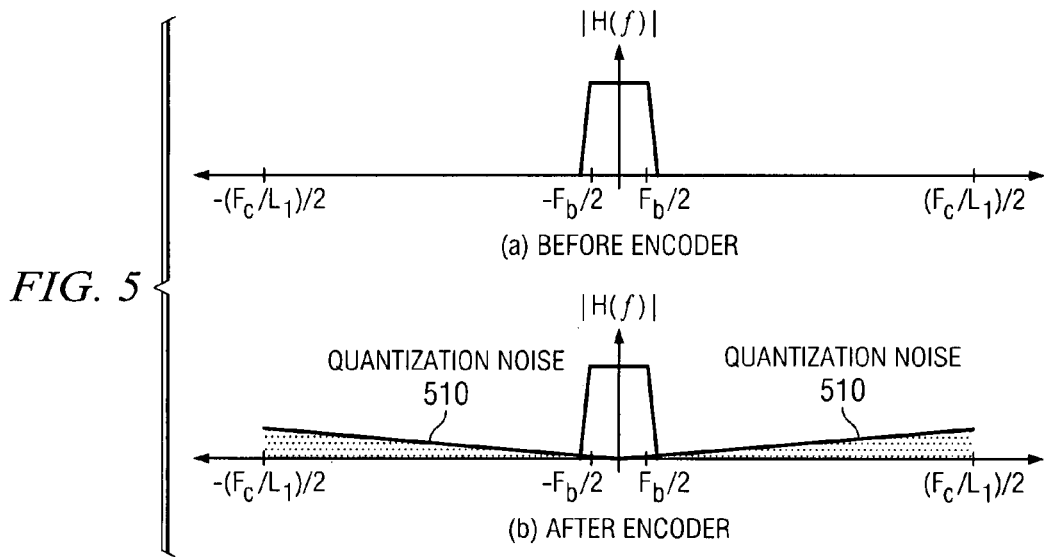
FIG. 5 is a graphical representation of exemplary noise spectra (a) before, and (b) after, input to the noise-shaping encoder(s) of the apparatus of FIG. 3.

The outputs of the interpolators 312 are coupled to the inputs of the noise-shaping encoders 302. These encoders are separate lowpass encoders in I and Q in the embodiment of FIG. 3, and are effectively up-converted and combined by digital quadrature modulator 316, resulting in a bandpass signal. Alternatively, a bandpass encoder following the quadrature modulator 316 could be substituted for the two lowpass encoders 302 before the quadrature modulator 316, as is shown in the configuration of FIG. 4. In either embodiment, the lowpass encoders are designed such that the signal energy from interpolators 312 is preserved in the baseband. FIG. 5 illustrates the spectrum (a) prior to encoding, and (b) at the output of encoders 302. The gray shaded portions 510 of FIG. 5 illustrate the quantization noise that results from the encoding process. The encoder creates quantization noise, but effectively pushes the quantization noise out of band so that most of the noise lies outside, between $F_b/2$ and $(F_c/L_1)/2$, advantageously resulting in a relatively high signal-to-noise ratio inside the band of interest between 0 and $F_b/2$.

As previously described herein, the quantization noise (generated by a typical noise-shaping encoder operating at sampling frequencies in the vicinity of the carrier frequency) may produce very high levels in the adjacent receive band of a full-duplex transceiver. This may result in serious degradation of the receiver if the noise is not adequately removed. One solution described herein entails placing one or more zeros of the encoder noise transfer function at selected frequencies where the quantization noise needs suppression. A simplest form of a second-order lowpass delta-sigma modulator has a noise transfer function (NTF) given below:

$$H(z)=1-2z^{-1}+z^{-2}$$

This results in two zeros at z=1, or 0 Hz. The zeros can be transformed from 0 Hz to another frequency by expressing the NTF as follows:

$$H(z)=1-2\cos(2\pi f_z/f_s)z^{-1}+z^{-2}$$

As an example, suppose the desired zeros are ±80 MHz, and the sampling rate of the encoder is 1.88 GHz. The NTF then becomes:

$$H(z)=1-1.928938z^{-1}+z^{-2}$$

Simulation performed by the Assignee hereof shows that the quantization noise at 80 MHz±$F_b/2$ is suppressed an additional 36 dB compared with the standard version of the second-order lowpass modulator having both zeros at 0 Hz. The tradeoff, however, is that some sort of multiplier must be incorporated within the logic to implement the coefficient, instead of a simple shift to implement a multiply by 2. This NTF no longer has infinite suppression at 0 Hz, and has limited suppression at the symbol band edges, ±$F_b/2$. Nonetheless, it still may be very useful in certain applications where such features are acceptable or desired.

As another alternative, an exemplary third-order encoder is configured such that a single zero is placed at 0 Hz, and the zeros at ±80 MHz are maintained as before. In order to keep the encoder stable, poles are placed in the NTF in addition to the zeros. While this may initially seem counter-intuitive, it will be appreciated that the noise-shaping filter is effectively contained within a quantized feedback loop. A comprehensive treatment on the design of stable high-order delta-sigma modulators is well known in the art, and can be found for example in Chapters 4 and 5 of the textbook by Norsworthy, et al., *Delta-Sigma Data Converters*, IEEE Press, 1997, previously incorporated herein.

The exemplary third-order noise-shaping encoder, again assuming a sampling rate of 1.88 GHz, having zeros at ±80 MHz and at 0 Hz, has a NTF given by the following relationship:

$$H(z) = \frac{(1-1.928938z^{-1}+z^{-2})(1-z^{-1})}{(1-1.427625z^{-1}+z^{-2})(1-0.625422z^{-1})}$$

Figure 6:
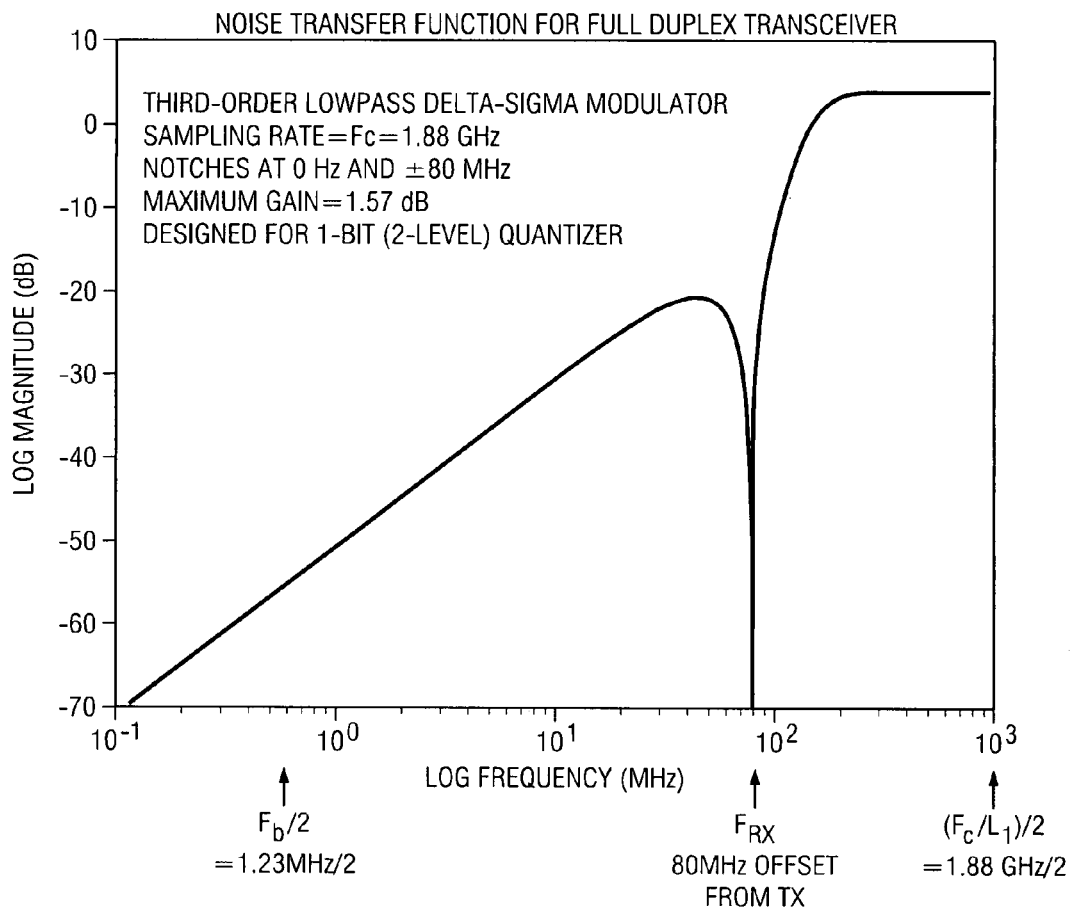
FIG. 6 is a graphical representation of a noise transfer function (full duplex transceiver) associated with an exemplary third-order noise-shaping encoder according to the invention.

The NTF for this encoder is illustrated in FIG. 6. Simulation shows that the quantization noise at 80 MHz±$F_b/2$ is suppressed an additional 26 dB compared with the standard second-order lowpass modulator having both zeros at 0 Hz. This is about 10 dB less suppression when compared with the second-order modulator with its zeros moved from 0 Hz to ±80 MHz. However, this third-order modulator has the advantage of excellent suppression at the symbol band edges, ±$F_b/2$, because there is a zero at 0 Hz. The tradeoff, however, is that at least one multiplier may need to be incorporated within the logic to implement at least one coefficient. Simulations have shown that the coefficients controlling the pole locations are not too sensitive to the stability and performance of the encoder due to roundoff errors, and simple choices can be found in implementing the pole locations in the z-plane, resulting in short coefficient word lengths that may be implemented with, for example, simple shift-add schemes. The extra logic required for the implementation of the carefully selected coefficient multiplications in many instances is relatively trivial. The reader is referred to Chapter 10 of the aforementioned textbook by Norsworthy, et al., which teaches techniques on the implementation of digital delta-sigma modulators.

The out-of-band gain of this exemplary third-order modulator is 1.57, which means that it is relatively stable for one-bit quantization, in accordance with Chapter 4 of the aforementioned textbook by Norsworthy, et al., where the suggested maximum out-of-band gain for stability is around 1.5 or slightly greater. This example is only one of many such noise-shaping encoders that can be designed, as various substitutions can be made, including but not limited to, the sampling rate, the locations of the poles and zeros, and the order of the encoder.

Similarly, a bandpass delta-sigma modulator using the lowpass-to-bandpass transformation z→−$z^2$ can be substituted in lieu of two lowpass delta-sigma modulators (one in I and one in Q), and the above example design can be directly transformed if so desired, and used as an embodiment of bandpass noise-shaping encoder 406 in FIG. 4. A comprehensive treatment on the design of bandpass delta-sigma modulators can be found in Chapter 9 of the aforementioned textbook by Norsworthy, et al.

The noise-shaping encoders 302 may employ either one-bit or multi-bit (n-bit) quantization. Ideally, the encoders 302 should be free of spurious tones in the spectrum, and it is often necessary to dither the encoders. A comprehensive treatment on dithered delta-sigma modulators may be found in Chapter 3 of the aforementioned textbook by Norsworthy, et al., wherein a stability criteria test for dithered multibit noise-shaping encoders is provided (p.130-131). A desirable characteristic is that the encoders have fully dithered quantizers, ensuring that the quantization noise is white. A used herein, the term "fully dithered quantizer" refers to the dither fully spanning one quantization interval. For example, for a ternary encoded quantizer, if the output levels are $\{1, 0, -1\}$, then the corresponding thresholds are $\{-0.5, 0.5\}$, the dither interval is therefore also $\{-0.5, 0.5\}$, and the dither generator creates pseudo-random values between these outer limits. The dither is arithmetically added to the input of the internal quantizer of the encoder. While it is often desirable to fully dither the quantizer, this limits the usable dynamic range of the encoder, and may degrade the stability. For virtually all known noise-shaping encoders, a fully-ditherd quantizer will require multibit quantization.

If the encoders 302 use ternary quantization of $\{1, 0, -1\}$, and if the coder is first order, and if the quantizer is fully dithered over $\{-0.5, 0.5\}$, then the stable input range of the incoming signal is also $\{-0.5, 0.5\}$. This surprising and elegant result has significant practical implications. Specifically, the maximum pulse density coming out of the encoders in this example is 0.5. If the dither range is limited so that it does not cover an entire quantization interval, then the input dynamic range could be increased. However, idle channel tones and spikes may possibly show up in the quantization noise spectrum.

In the foregoing CDMA-based examples, it was shown how a second- or third-order encoder could be designed to meet certain system requirements. For TDMA systems (including for example GSM), or other systems with less stringent out-of-band noise requirements, it may be possible to use first-order encoders. In systems such as TDMA, where the receiver and transmitter are not on at the same time, the suppression of quantization noise outside the transmit band of interest is not nearly as critical. In fact, a more trivial delta-sigma modulator may be employed. The simplest known delta-sigma modulator is a first-order modulator. There are good reasons why one would consider the encoders 302 to be the lowest order possible, in order to keep the quantization noise from rising too sharply out of band. First-order delta-sigma modulators have historically been avoided altogether since the invention of second- and higher-order modulators in the early 1980's. In nearly all known commercial applications, first-order modulators are avoided because of their inherent generation of high levels of spurious tones, which cause them to be virtually unusable in many practical system designs. A first-order encoder causes the quantization noise to rise at only 9 dB/octave, while a second-order encoder's noise will rise at 15 dB/octave, and a third-order encoder's noise will rise at 21 dB/octave. The passive resonators (FIGS. 10, 11) must attenuate the out-of-band quantization noise, and the resonators should ideally have a low-order characteristic in order to keep the insertion losses as low as possible. For example, a single-section bandpass resonator will have an attenuation of 6 dB/octave on each side of the resonant frequency. Meeting a 9 dB/octave rise in quantization noise with a 6 dB attenuation from the resonator will still cause the quantization noise to rise a net 3 dB/octave. If the oversampling ratio is 2048, then there are approximately 11 octaves of net rise at 3 dB/octave, which may result in too much out-of-band noise and not meeting the spectral requirements for the end-system. Hence, another means of attenuating the out-of-band quantization noise is introduced in the exemplary sample-and-hold interpolators 318 (FIG. 3), which introduce spectral zeros at DC and at multiples of $4F_c$, effectively alleviating the problem of inadequate attenuation from the resonator alone, and rolling off the out-of-band energy at a dramatic rate.

Referring again to FIG. 3, the outputs of noise-shaping encoders 302 are coupled to the inputs of sample-and-hold interpolators 318, having an interpolation ratio of the product of $L_1$ and $L_2$. The purpose of these sample-and-hold interpolators 318 is to interface the output sample rate of the noise-shaping encoders with the modulation frequency of the digital quadrature modulator 316.

Several examples will be provided below that help describe the operation and behavior of the DARP converter apparatus 300 of FIG. 3.

EXAMPLE 1

Referring back to the embodiment of FIG. 3, we choose $L_1=1$ and $L_2=4$. We also set the phase offset, $\theta=0$, inside the cos( ) and sin( ) arguments driving the I- and Q-modulators. Data sample $\{i_k\}$ is the kth sample coming from the in-phase encoder 302a, and similarly, data sample $\{q_k\}$ is the kth sample coming from the quadrature encoder 302b. Using a clock at a rate $4F_c$, which is four times higher than the carrier frequency $F_c$, samples from the encoders are effectively sampled and held by interpolators 318 four successive times before the next kth sample arrives. I- and Q-modulators 320 are effectively arithmetic multipliers. The multipliers each have two inputs and one output. I-modulator 320a receives the in-phase samples from interpolator 318a, and also receives a periodic sequence $\{1, 0, -1, 0\}$, which is the result of the trigonometric operation $\cos(2\pi n/4)$, the in-phase version of the carrier frequency $F_c$ having four samples per carrier cycle. Similarly, Q-modulator 320b receives the quadrature samples from interpolator 318b, and also receives a periodic sequence $\{0, 1, 0, -1\}$, which is the result of the trigonometric operation $\sin(2\pi n/4)$, the quadrature version of the carrier frequency $F_c$ having four samples per carrier cycle. The result of these operations is the creation of $\{i_k, 0, -i_k, 0\}$ at the output of the I-modulator 320a, and $\{0, q_k, 0, -q_k\}$ at the output of the Q-modulator 320b. Hence, every in-phase encoder sample $\{i_k\}$ at $F_c$ is transformed into a four-phase packet $\{i_k, 0, -i_k, 0\}$ at $4F_c$, and every quadrature encoder sample $\{q_k\}$ at $F_c$ is transformed into a four-phase packet $\{0, q_k, 0, -q_k\}$ at $4F_c$. The combiner 324 then produces the data sequence $\{i_k, q_k, -i_k, -q_k\}$ every carrier cycle, or period of $F_c$. If the noise-shaping encoders (14) are constrained to binary quantization, then there are four possible such data sequences every carrier cycle: $\{1,1, -1, -1\}$, $\{1, -1, -1,1\}$, $\{-1, -1,1, 1\}$, $\{-1,1,1,-1\}$. Each one of these data sequences represents one of four possible signal constellation points. For a comprehensive treatment on passband data transmission and phase shift keying (PSK) signal constellations in particular, the reader is referred to the text, *Data Communications Principles*, by Gitlin et al., Plenum Press, 1992, Chapter 5, beginning on p.325.

EXAMPLE 2

As in the previous EXAMPLE 1, $L_1=1$ and $L_2=4$. This time, however, the phase offset, $\theta=\pi/4$, is set inside the cos( ) and sin( ) arguments driving the I- and Q-modulators. Note that setting the phase offset to $\pi/4$ is important in some instances. In particular, the CDMA standards of IS-95, IS-95a, IS-98, and IS-2000 call for a $\pi/4$ offset QPSK as a mode of modulation. It is well known to one of ordinary skill in the art of data modulation, that using $\pi/4$ offset QPSK, as opposed to zero offset, has the benefit of reducing the peakto-average, otherwise known as the crest factor. Going back to the prior description of operation, data sample $\{i_k\}$ is the kth sample coming from the in-phase encoder 302a, and similarly, data sample $\{q_k\}$ is the kth sample coming from the quadrature encoder 302b. Using a clock at a rate $4F_c$, which is four times higher than the carrier frequency $F_c$, samples from the encoders are effectively sampled and held by interpolators 318 four successive times before the next kth sample arrives. I- and Q-modulators 320a, 320b are, in the illustrated embodiment, effectively arithmetic multipliers. The multipliers each have two inputs and one output. The I-modulator 320a receives the in-phase samples from the interpolator 318a, and also receives a periodic sequence $\{1,-1,-1,1\}$, which is the result of the trigonometric operation $\cos(2\pi n/4 + \pi/4)$, the in-phase version of the carrier frequency FMC. Similarly, the Q-modulator 320b receives the quadrature samples from the interpolator 318b, and also receives a periodic sequence $\{1,1,-1,-1\}$, which is the result of the trigonometric operation $\sin(2\pi n/4+\pi/4)$, the quadrature version of the carrier frequency $F_c$. (Note that we have taken the sign of the $\cos(\ )$ and $\sin(\ )$ arguments here, ignoring the $1/\sqrt{2}$ multiplier, a result of the $\pi/4$ offset, for the moment.) The result of these operations is the creation of $\{i_k, -i_k, -i_k, i_k\}$ at the output of the I-modulator, and $\{q_k, q_k, -q_k, -q_k\}$ at the output of the Q-modulator. Hence, every in-phase encoder sample $\{i_k\}$ at $F_c$ is transformed into a four-phase packet $\{i_k, -i_k, -i_k, i_k\}$ at $4F_c$, and every quadrature encoder sample $\{q_k\}$ at $F_c$ is transformed into a four-phase packet $\{q_k, q_k, -q_k, -q_k\}$ at $4F_c$. The combiner 324 then produces $\{(i_k+q_k), (-i_k+q_k), (-i_k-q_k), (i_k-q_k)\}$.

If the noise-shaping encoders 302 are constrained to binary quantization, then there are four possible such data sequences every carrier cycle: $\{2,0,-2,0\}$, $\{0,2,0,-2\}$, $\{-2,0,2,0\}$, $\{0,-2,0,2\}$. This results effectively in the insertion of every other sample being a zero, allowing the resonator and switch to rest or settle between sample hits, and reducing the probability of inter-symbol interference at the switch-resonator interface.

Figure 7:
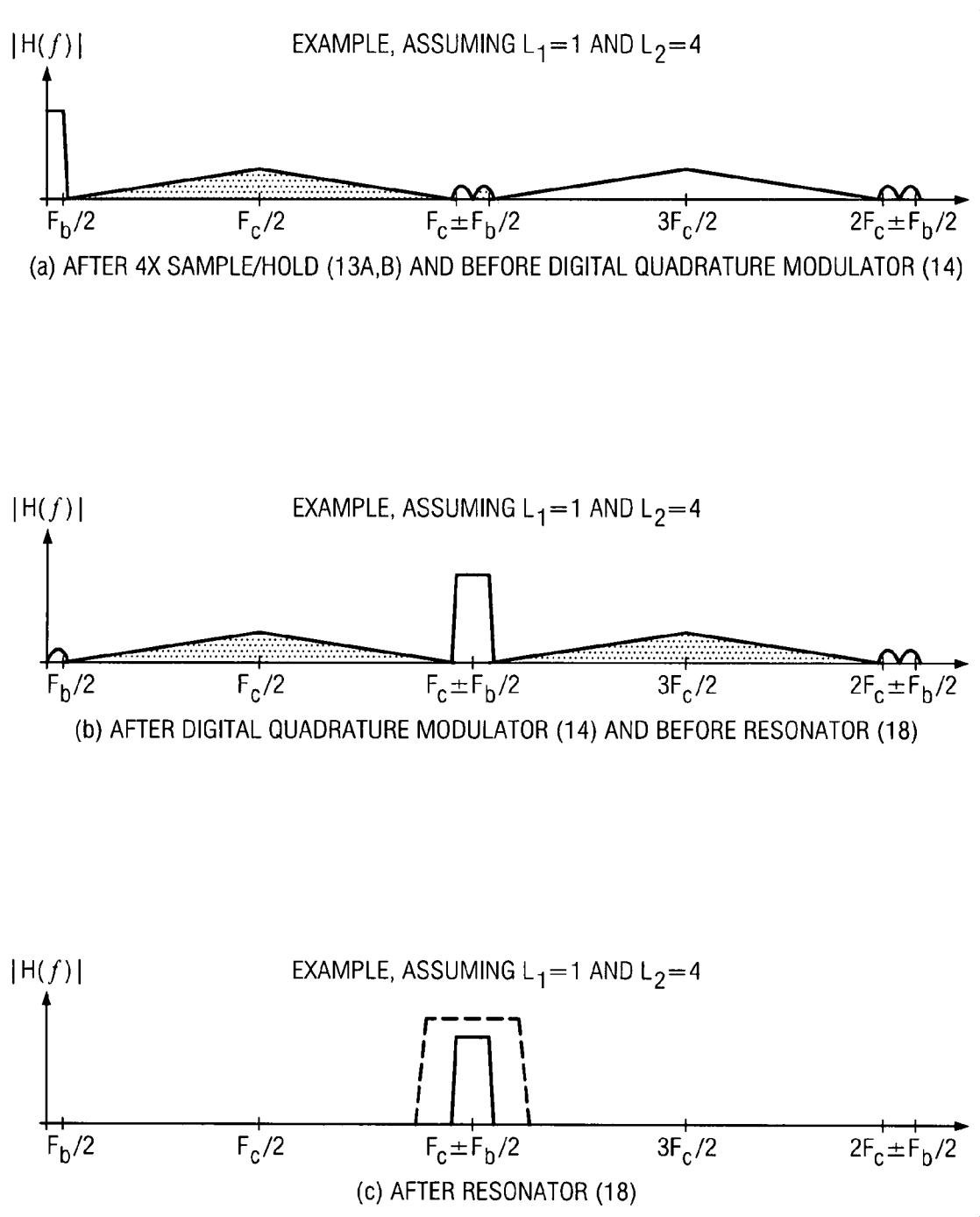
FIG. 7 is a graphical representation of first exemplary noise spectra for $L_1=1$ and $L_2=4$ (a) before the digital quadrature modulator, (b) after the digital quadrature modulator but before the resonator, and (c) after the resonator, of the apparatus of FIG. 3.

The spectral relationships for EXAMPLES 1 and 2 are graphically illustrated in FIG. 7.

EXAMPLE 3

As in the previous EXAMPLE 2, $L_1=1$, $L_2=4$, and $\theta=\pi/4$. However, ternary quantization is used within the noise-shaping encoders 302. Therefore, there are nine possible data sequences every carrier cycle, and the constellation map would consist of a rectangular arrangement of nine symbol points at the following I-Q coordinates: $(1,0)$, $(1,1)$, $(0,1)$, $(-1,1)$, $(-1,0)$, $(-1,-1)$, $(0,-1)$, $(1,-1)$, and $(0,0)$. The nine possible data sequences corresponding to these nine symbol points on the constellation map would therefore be: $\{1,-1,-1,1\}$, $\{2,0,-2,0\}$, $\{1,1,-1,-1\}$, $\{0,2,0,-2\}$, $\{-1,1,1,-1\}$, $\{-2,0,2,0\}$, $\{-1,-1,1,1\}$, $\{0,-2,0,2\}$, $\{0,0,0,0\}$.

EXAMPLE 4

In this case, $L_2=2$, but every parameter is the same as in EXAMPLE 2, i.e., $L_1=4$ and $\theta=\pi/4$. This effectively lowers the sampling rate of the encoders 302 by a factor of two to $F_c/2$ and makes the sample/hold interpolation ratio, $L_1L_2=8$, so that the output rate of the sample/hold interpolators 318 is still $4F_c$ as before. Therefore, one new data sample, $\{i_k\}$ or $\{q_k\}$, is produced by the noise-shaping encoders 302 every eight clock cycles of the digital quadrature modulator 316. The result of these operations is the creation of $\{i_k, -i_k, -i_k, i_k\}$ twice in a row at the output of the I-modulator, and $\{q_k, q_k, -q_k, -q_k\}$ twice in a row at the output of the Q-modulator 320b. Hence, every I-encoder sample $\{i_k\}$ at $F_c/2$ is transformed into a eight-phase packet $\{i_k, -i_k, -i_k, i_k, i_k, -i_k, -i_k, i_k\}$ at the output of the I-modulator 320a at a rate of $4F_c$, and every Q-encoder sample $\{q_k\}$ at $F_c/2$ is transformed into a eight-phase packet $\{q_k, q_k, -q_k, -q_k, q_k, q_k, -q_k, -q_k\}$ at the output of the Q-modulator 320b at a rate of $4F_c$. The combiner 324 then produces $\{(i_k+q_k), (-i_k+q_k), (-i_k-q_k), (i_k-q_k)\}$ twice in a row. If the noise-shaping encoders 302 are constrained to binary quantization, then there are four possible such data sequences every carrier cycle: $\{2,0,-2,0,2,0,-2,0\}$, $\{0,2,0,-2,0,2,0,-2\}$, $\{-2,0,2,0,-2,0,2,0\}$, $\{0,-2,0,2,0,-2,0,2\}$.

Figure 8:
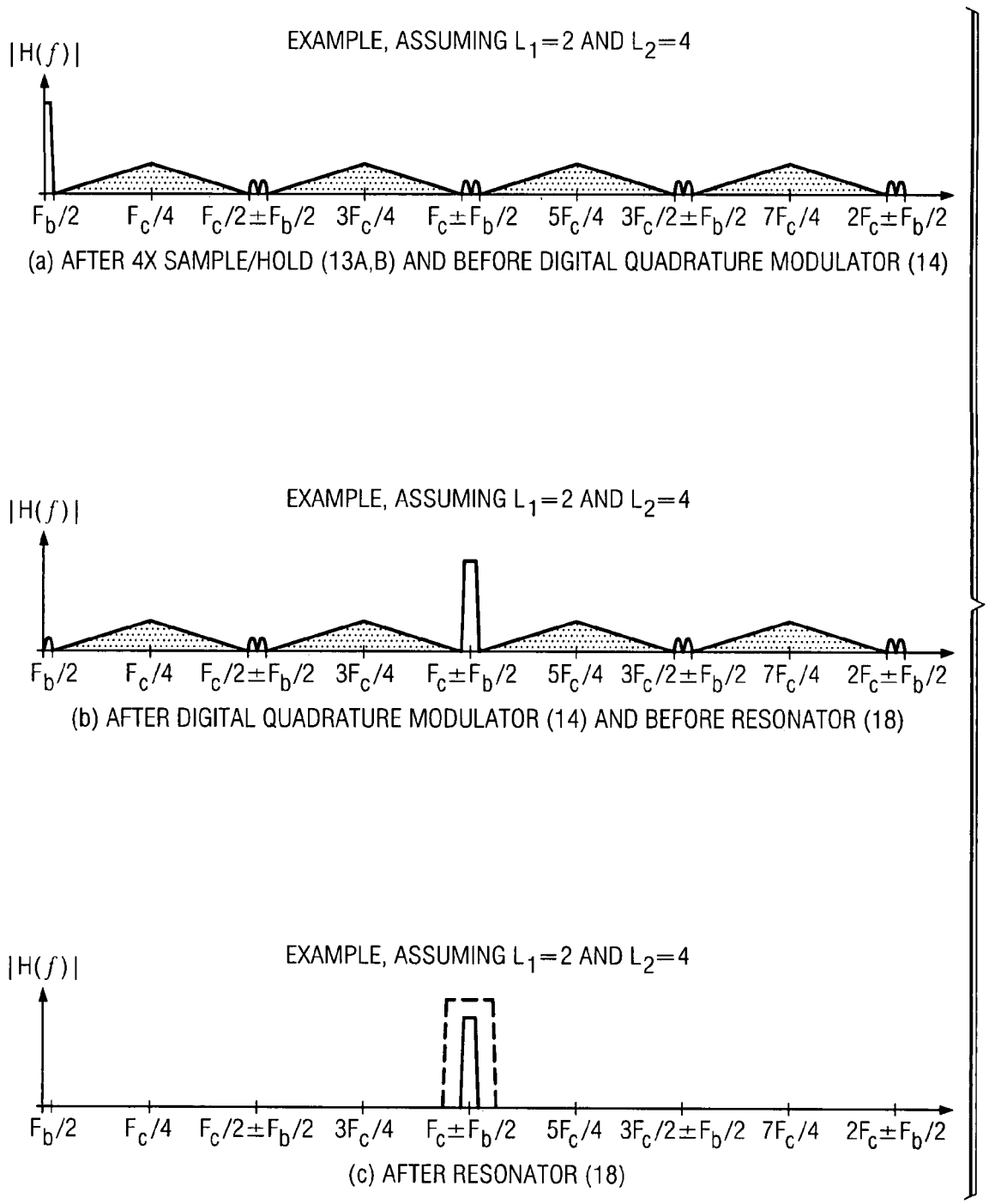
FIG. 8 is a graphical representation of second exemplary noise spectra for $L_1=2$ and $L_2=4$ (a) before the digital quadrature modulator, (b) after the digital quadrature modulator but before the resonator, and (c) after the resonator, of the apparatus of FIG. 3.

The spectral relationships for this example are graphically illustrated in FIG. 8.

EXAMPLE 5

Figure 9:
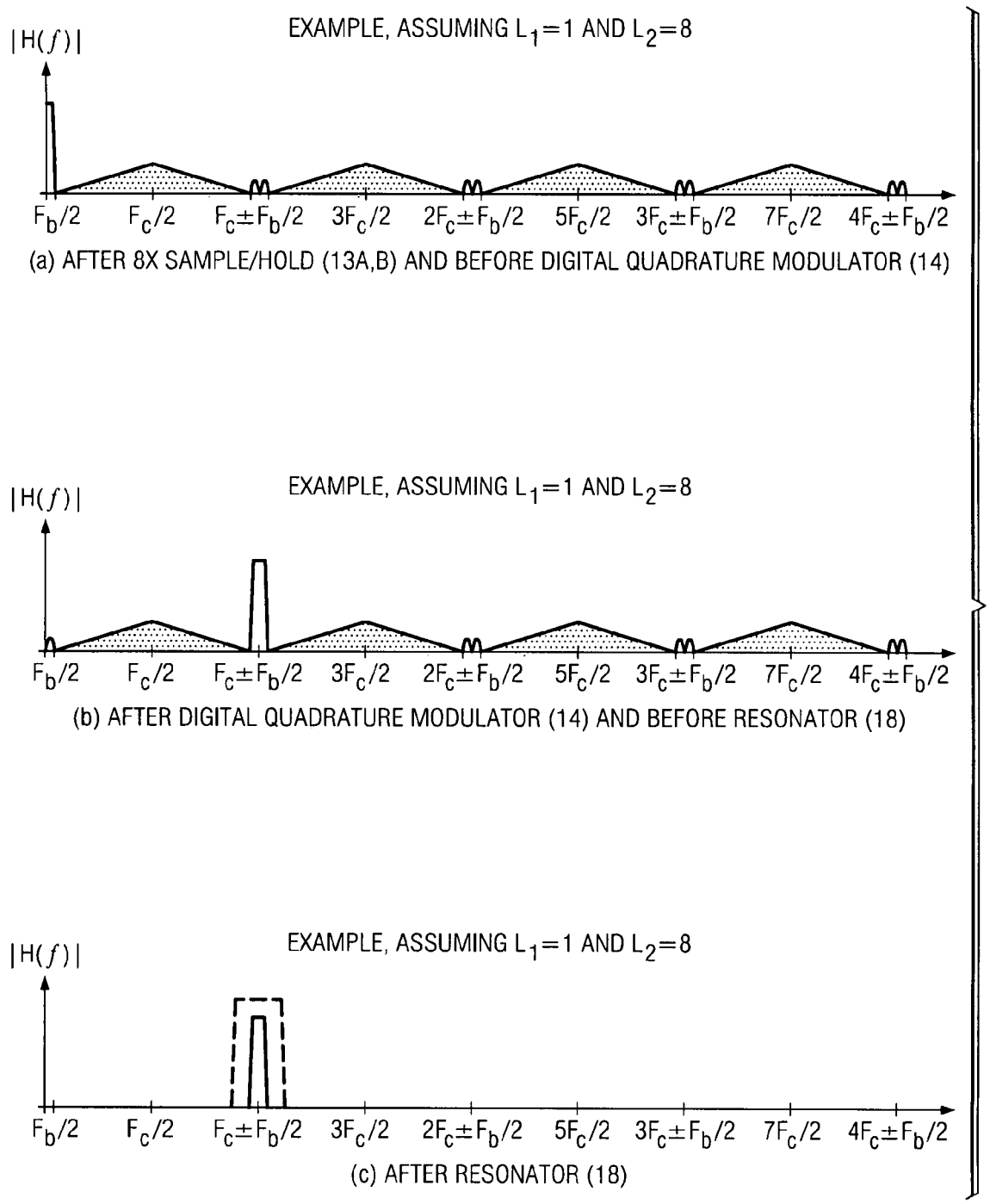
FIG. 9 is a graphical representation of third exemplary noise spectra for $L_1=1$ and $L_2=8$ (a) before the digital quadrature modulator, (b) after the digital quadrature modulator but before the resonator, and (c) after the resonator, of the apparatus of FIG. 3.

It will be recognized that the present invention could be practiced using any length phase packet or any number of quantization levels in the noise-shaping encoders. For example, if we desire eight (8) unique phase states per carrier cycle, then we could set $L_1=1$ and $L_2=8$, set the number of quantization levels to binary, and set both the digital quadrature modulator 316 and the charging switches 304 operate at $8F_c$. The spectral relationships of this example are graphically illustrated in FIG. 9.

The action of the sample/hold interpolators 318 places as sinc(x) function on the spectrum to appear as depicted in FIG. 7(a), placing spectral zeros at multiples of $F_c$. The action of the quadrature modulators 320 effectively shifts the spectrum up to where the passband is centered at $F_c$, as depicted in FIG. 7(b). Two other illustrative examples can be seen in FIGS. 8 and 9. In FIG. 8, $L_1=2$ and $L_2=4$, while in FIG. 9, $L_1=1$ and $L_2=8$.

While several possible examples have been provided, many other such combinations of parameters are also possible within the scope of this invention. Therefore, it will be plainly recognized that the invention is in no way limited only to the foregoing examples. Additional examples for other combinations of interpolation ratios, phase packet lengths, sampling rates, constellation maps, and the like, can be readily derived by one of ordinary skill in the art given the present examples in this disclosure.

It will further be recognized that the dither scheme and apparatus described in detail in co-owned and co-pending U.S. patent application Ser. No. 10/382,326 entitled "CODER APPARATUS FOR RESONANT POWER CONVERSION AND METHOD" filed contemporaneously herewith, which claims priority benefit of U.S. provisional patent application Ser. No. 60/361,813 of the same title filed Mar. 4, 2002, previously incorporated by reference herein, may be used consistent with the present invention. This dither method and apparatus may be applied to literally any type of encoder of any order (i.e., one through "nth" order), including that described herein, and may utilize any decimation factor greater than 1 including, e.g., 2, 4, 8, or even non-powers of 2.

The outputs of the quadrature modulators 320 are summed in quadrature with the combiner 324, and passed on to the corresponding switch(es) 304. GaAs MESFET switches of the type well known in the art in 0.35-micron technology are used, although other processes (such as 0.18 micron or 0.1 micron) may be substituted. Device models correlated from actual measured transistors at a GaAs semiconductor wafer foundry have also been used herein as a simulation basis. Gallium arsenide (GaAs) MESFET or PHEMT switches are commonly used when a combination of speed, power, and efficiency requirements make them an attractive choice. However, the switches 304 of the illustrated embodiment may be implemented in any one of many available technologies, the invention not being limited to GaAs switch technology. For example, complementary oxide metal semiconductor (CMOS) switches meeting the speed, power, and efficiency requirements for a particular application may be useful, and also desirable from a cost perspective.

Nor is the present invention limited in any way to FET device types. For example, a bipolar switch may be sufficient in some applications of the invention in place of the FET. Accordingly, the switches 304 of FIG. 3 are represented as simple ideal switch models.

While it is well known to one of ordinary skill in the art that GaAs MESFETs make efficient high speed power switches due to their inherent high electron mobility and other salient physical properties, it is also recognized that GHz-speed logic in CMOS is extremely power consumptive if the outer limits of the technology are pushed, where current-mode logic is needed to meet the speed requirements. It will be appreciated that while GaAs MESFET logic has a much lower power-delay product than CMOS, particularly at the most extreme end of the technology limits, GaAs technology is generally not considered a tenable choice for digital processing logic (such as that of the exemplary processor 310 of FIG. 3) at the time of this invention disclosure. Additionally, taking high-speed clocks on and off chip at GHz speeds can be very power consumptive due to a high $CV^2F$ power loss factor. Heretofore, these issues posed a difficult dilemma with no clear answer.

The benefits of the present invention would therefore be further leveraged through a switch solution that addressed these issues; i.e., which further lowered power consumption and cost. One such power- and cost-efficient solution comprises integrating the encoder 302 and charging switches 304 on one monolithic GaAs chip. One of ordinary skill in the art will appreciate that GaAs and other III-V compound semiconductors are well suited for RF power amplifiers and switches operating at RF speeds. Other semiconductor technologies may be similarly suited, such as silicon germanium (SiGe) and indium phosphide (InP), and others may emerge over time that also provide RF logic and power integration benefits. The lower-speed logic circuits of FIG. 3 or 4, however, can readily be implemented in CMOS, while a parallel-to-serial interface and a serial-to-parallel interface combination can be utilized between the lower speed CMOS logic and the higher speed GaAs encoder logic 302 and switches 304.

Hence, the present invention contemplates any variety of different configurations, including notably use of "hybrid" GaAs and CMOS configurations (i.e., certain portions of the apparatus of FIG. 3 on GaAs and other portions of the apparatus in CMOS). For example, in one embodiment, RF components including the noise shaping encoders 302, Sample-and-hold interpolators 318, digital quadrature modulator 316, and charging switches 304 are disposed on one or more GaAs devices, while the data processor 310 and first interpolators 312 are disposed in a separate CMOS device coupled to the GaAs device(s) via parallel-to-serial and serial-to-parallel interfaces. Other arrangement using GaAs and CMOS for various of the components of the apparatus 300 may be used consistent with the invention.

The switches 304 may be configured in any number of standard configurations, like the push-pull configuration shown in FIG. 4. In FIG. 3, the switches 304 are shown coupled to a resonator 306 through a balun transformer 308, which is effectively a differential-to-single-ended converter. The transformer 308 and/or resonator 306 may be implemented in many different ways, including but not limited to magnetically coupled transformers, coupled microstrip or stripline transformers, coaxial ceramic resonators, or helical resonators. The transformer 308 may also incorporate some or all of the desired characteristics of resonator 306.

The center resonant frequency of the transformer 308 and resonator 306 are both set at $F_c$. The resonator is assumed to have a relatively high unloaded Q-factor, so that its energy storage capability is high and very little power is wasted in the process. For example, if $F_c$ equals 1.88 GHz, and if the desired bandwidth of the transmitter is 100 MHz, then the loaded Q is 1880 / 100=18. If the efficiency loss of the resonator is 5%, then unloaded Q is 18 / 0.05=360. The resulting spectral inputs and outputs of the resonator are depicted in FIGS. 7(c), 8(c), and 9(c). The resonator effectively removes the out-of-band quantization noise from the noise-shaping encoders 302 to an acceptable level.

In another exemplary embodiment, the transformer 308 and resonator 306 are combined with a helical resonator. Helical resonators are well known in the art, and information thereon can be found for example in *Reference Data for Radio Engineers*, Fifth Edition, copyright Howard W. Sams & Co. (ITT), pages 22-28 through 22-30. The coupling between the switches 304 and the helical resonator 306 may be either probe, loop, or aperture coupling. On especially useful method of coupling is loop coupling because both the phase and the anti-phase polarities may be easily obtained, although it will be recognized that other methods may be used with success in the invention.

FIG. 4 depicts in relevant part an equivalent circuit diagram of the switch/transformer/resonator interfaces. The switches can be configured as differentially charging the resonator's equivalent capacitor $C_T$. The resonator's equivalent capacitor $C_T$ is commutated (turned over in polarity) by the resonator's equivalent inductor $L_T$ during the time periods of the zero states. The coupling is depicted as a transformer with turns ratio N. For the input coupling, the transformer is depicted as $N_i$ with two opposite— phased primary windings and one secondary winding, and for the output coupling, the transformer is depicted as $N_o$ with one primary winding and one secondary winding. The effective turns ratios $N_k$ transform the impedances as the square of the turns ratio such that the switches can supply the required amount of charge to the $C_T$ in the time that the switches are closed.

Following the resonator 306, any combination of elements, including but not limited to, a lowpass filter, a transmit/receive (T/R) switch, or a duplexer, may be optionally employed before, or as part of, the antenna connection 309. For example, FIG. 11 illustrates the incorporation of the transformer 308 and resonator 306 into a duplexer 1102 in an efficient manner that potentially saves cost and improves efficiency by reducing the number of separate elements needed to provide the functionality required in a given application.

Regarding the resonator and transformer bandwidths, by way of example, IS- 95, IS-95a, IS-98, and IS-2000 include the North American PCS transmit bands covering 60 MHz, from 1.85-1.91 GHz. If the transformer 308 and resonator 306 l have a fixed tuning, it may be desirable to make their frequency response wider than 60 MHz for several reasons: (1) to keep the insertion loss at the band edges at a minimum; and (2) to keep phase shifts and reflection coefficients from varying too much over the frequency band of interest. In applications where a more narrowband resonator is allowed, or where the resonator can be automatically tuned on the fly, these problems may be mitigated to some degree, and a greater amount of out-of-band rejection of quantization noise from the noise-shaping encoders may result, providing a cleaner and more coherent output, and more efficiency from the switch delivering energy into the desired band and less of the energy wasted in non-coherent excitation. However, a narrower resonator bandwidth requires a greater unloaded Q to keep the insertion losses from being too great, which could partially defeat the benefits of added efficiency.

Figure 12:
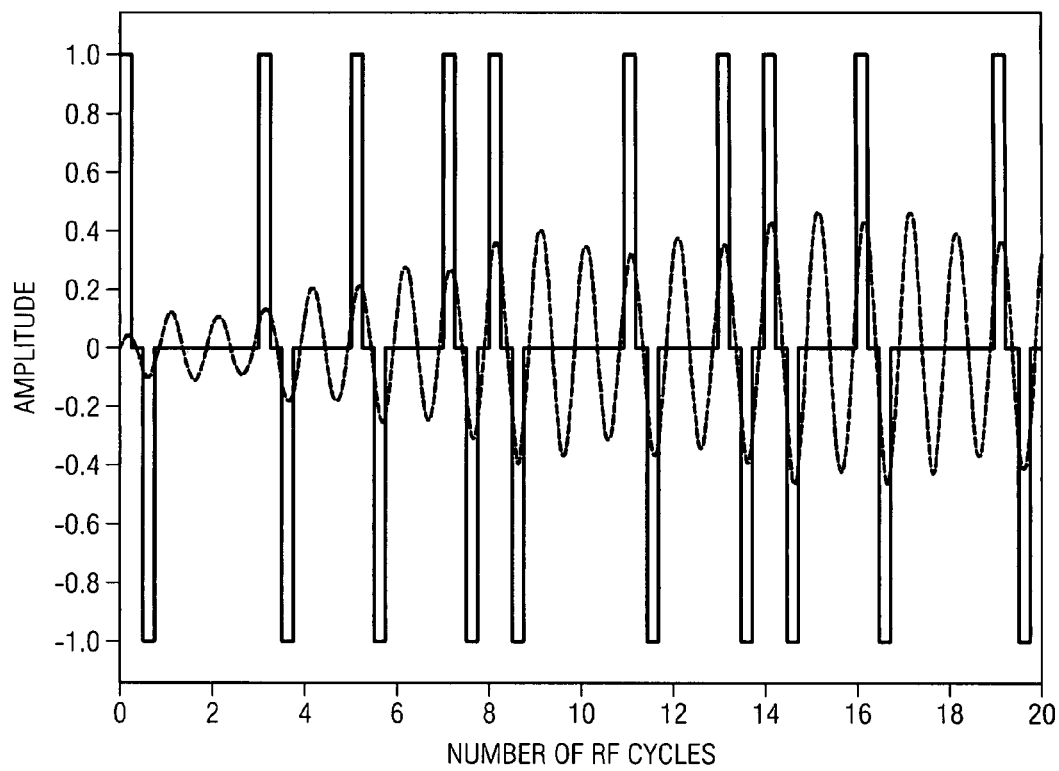
FIG. 12 is a graphical representation of the time-domain response of an exemplary resonator configuration of the invention to a short sequence of switch excitations.

The transformer 308 and/or resonator 306 are charged positively (at the peaks) and negatively (at the valleys) of the carrier frequency $F_c$ every 180 degrees by the data coming out of the switches 304. A time-domain plot (FIG. 12) illustrates this concept. This action ensures that energy is not wasted by charging the resonator at the wrong moment in time, but this most efficient action only occurs during periods when the amplitude and phase is very slowing changing, or when the encoder has a high pulse density. A more rapid change of modulation or a low pulse density results in more frequent anti-phasing or discharging of the resonator.

In some applications, amplitude and power level control can be performed in a purely digital fashion by simply changing the digital gain anywhere in the digital data path. It may be accomplished at the lowest sample rate in the digital processor 310 prior to the interpolators 312. Alternatively, it may be accomplished during or after the interpolation filter 312. For CDMA IS-95 or CDMA 2000, the output power level of the handset must be able to vary over at least an 80 dB range.

There are at least two significant advantages to adding analog power control as an extra degree of freedom to the digital power level scheme. Depending on the characteristics of the encoders 302, there may not be enough dynamic range to vary the output power purely in an all-digital manner and still meet the out-of-band energy suppression required by the system standard, especially in CDMA. Secondly, the efficiency of the system shown in FIG. 3 is greatly improved at lower power levels by allowing the DC bias to vary or step down at the lower power levels, and still provide enough bias to keep the switch in a useful range of operation. The design of DC-DC converters is well known and commonly practiced in the art, and therefore not further described herein.

In addition to DC bias control, a digitally controlled on-the-fly device-size scaling of the switches may be used to provide additional power control. One may think of this as a semi-digital mechanism that incorporates analog and digital aspects working together. Assuming the switches are operating as current-limited devices rather than voltage-limited devices, they do not need to be as large as at the high power levels, since the current of the switch is proportional to the device area. At lower power levels, less current is needed, hence, less device area.

Therefore, with the DARP converter as disclosed herein, power gain control may be purely digital or a combination of digital and analog, depending on the tradeoffs needed in the application.

It may be desirable to provide an on-the-fly dynamic impedance termination during periods when both switches 304a, 304b are open, especially during times when long string of zeros is coming out of the digital quadrature modulator 316. In this case, a separate termination switch 1002 (FIG. 10) can effectively switch on to activate a termination impedance network 1004, consisting of an imaginary part, which is a DC blocking capacitor, and a real part, some sort of resistor whose value is approximately equal to the driving point impedance looking into the transformer 308. The advantage of this termination network is that it keeps undesirable reflections from the load impedance 309 from interfering with the ideally expected linear time-invariant behavior of the resonator as seen by the charging switches 304.

While this invention disclosure has dealt with a rectangular or Cartesian I-Q coordinate system representation, it will be obvious to one of ordinary skill in the art of digital communications systems that these same concepts can be implemented in polar form instead of rectangular form, such that the I and Q vectors are converted into the polar form of magnitude and phase at some point in the signal processing path of the apparatus of FIG. 3 or 4. Also, it is known in the prior art that noise-shaped encoding can be performed on the magnitude vector, and on the phase vector, rather than on the I and Q vectors only. It will be appreciated that the switches 304 can be driven from the quantized noise-shaped phase information, and 'envelope restoration' techniques known in the art of Class-E amplifier design can be applied to modulate the DC power supply containing the magnitude or envelope. The signal bandwidth of the envelope is approximately equal to the symbol bandwidth set by the symbol-rate interpolation filter described herein, so the envelope information may vary at a slower rate than the phase information. Hence, based on a combination of this invention disclosure and on the known art relating to efficient Class-E amplifier design and envelope restoration techniques, that a specific alternative embodiment may be readily obtained, and that such an alternate embodiment may have some advantages over the rectangular coordinate-based examples detailed in this disclosure. Because such polar techniques are known in the art, they are assumed a fundamental alternative embodiment of this invention as described above without the need for further detail or disclosure herein.

FIGS. 13-20 herein provide additional MATLAB simulation outputs of various aspects of the invention.

Figure 13:
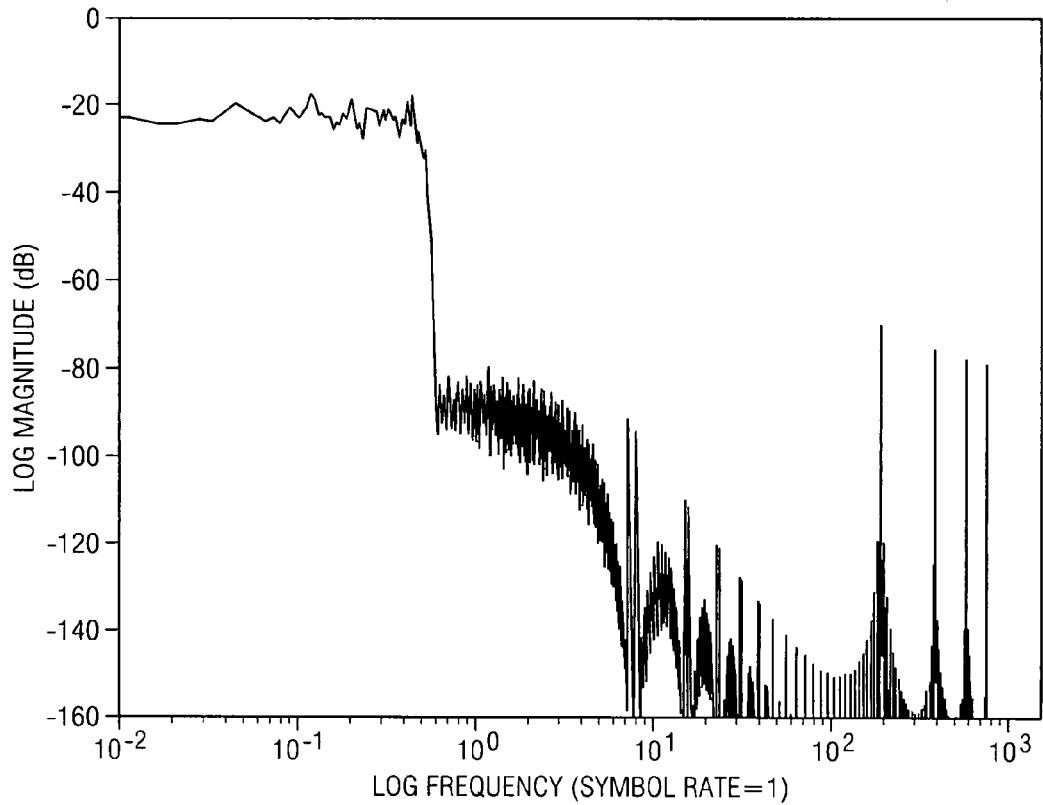
FIG. 13 is a graphical representation of exemplary spectral output from the final stage of interpolation filtering at 1536 times the symbol rate (images suppressed as previously discussed)

FIG. 13 illustrates the spectral output of the final stage of interpolation filtering at 1536 times the symbol rate.

Figure 14:
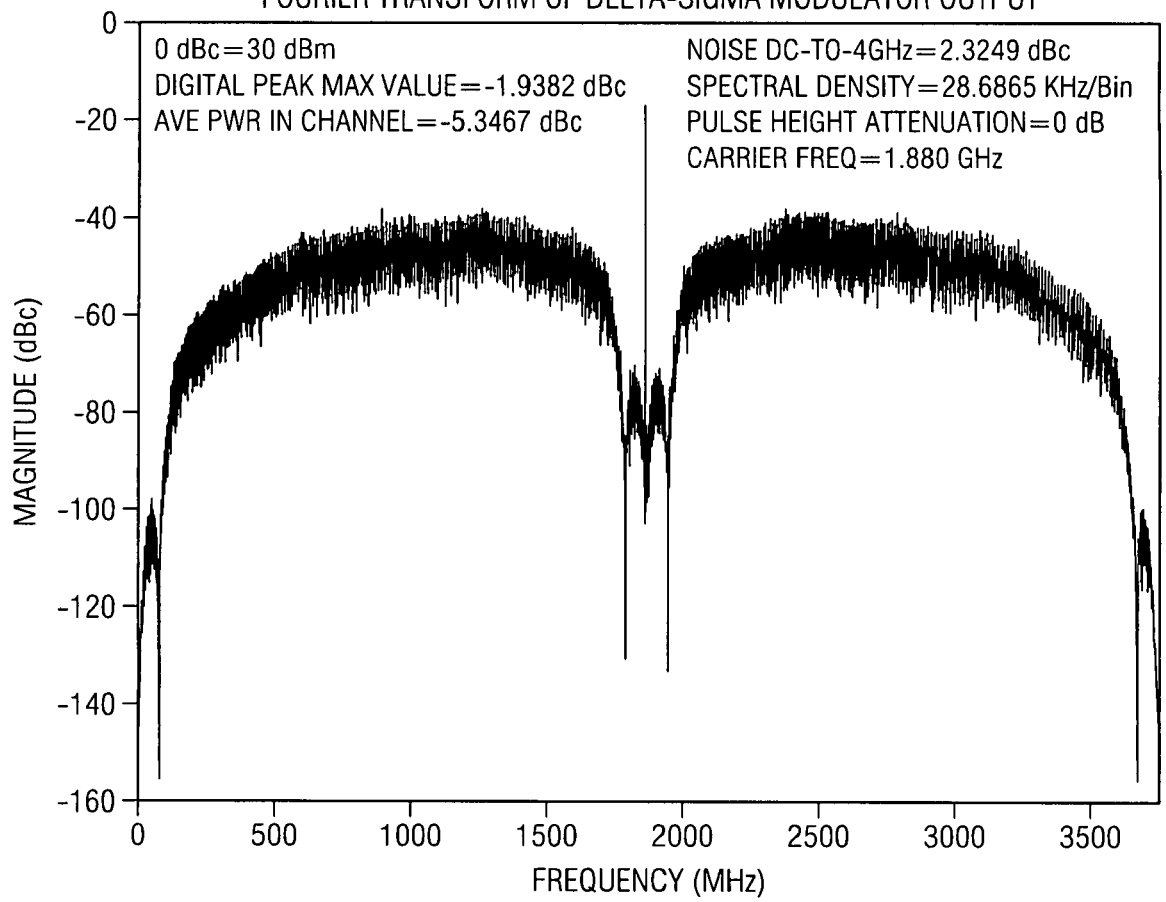
FIG. 14 is a graphical representation of exemplary spectral output from the encoder, at the input to the switches.

FIG. 14 illustrates the spectral output of the encoder 302, at the input to the switches 304. The third-order modulator previously described in the invention disclosure was used as the basis for generating this output.

Figure 15:
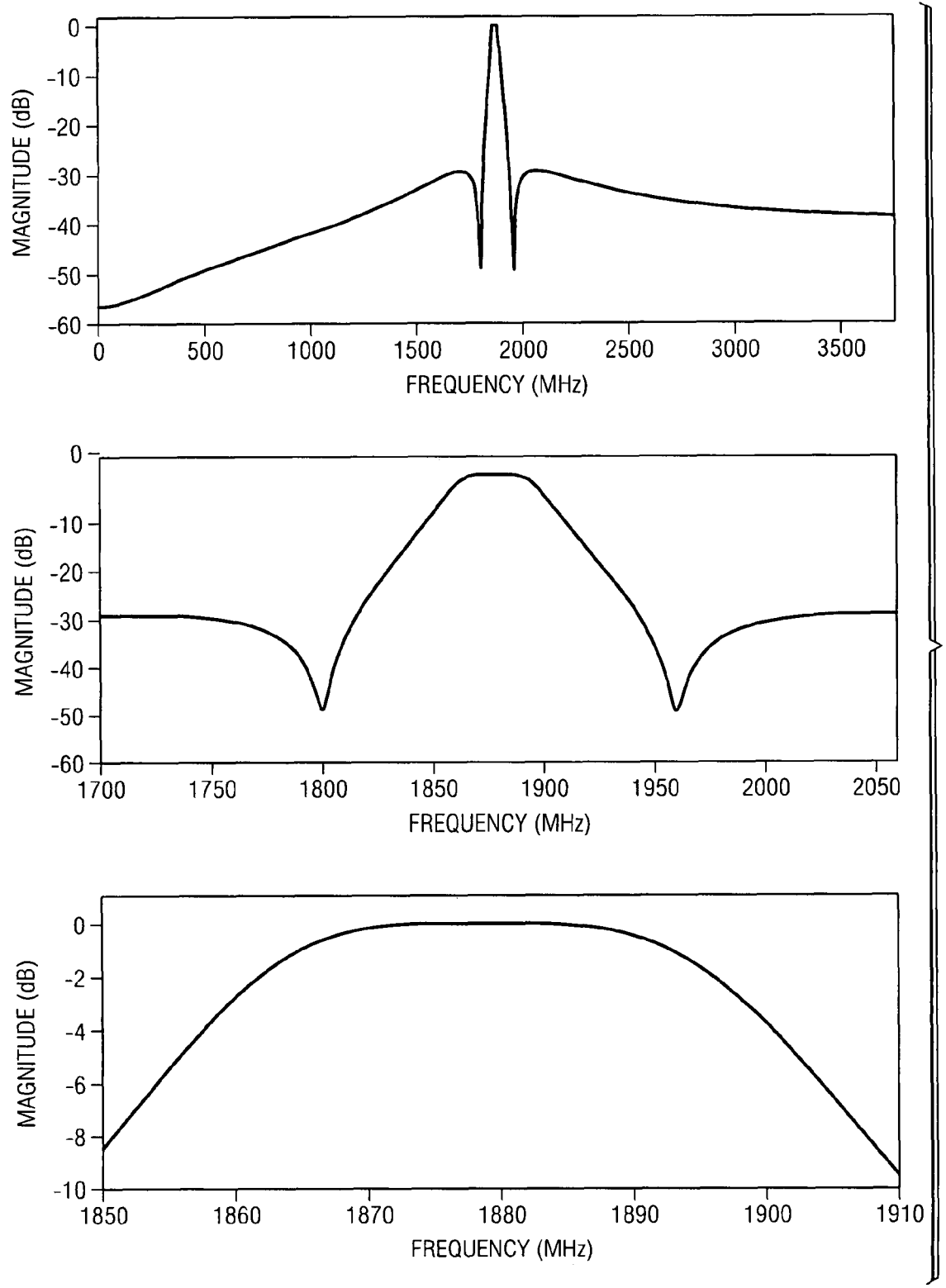
FIG. 15 is a graphical representation of exemplary frequency response of the resonator.

FIG. 15 illustrates the frequency response of the exemplary resonator 306.

Figure 16:
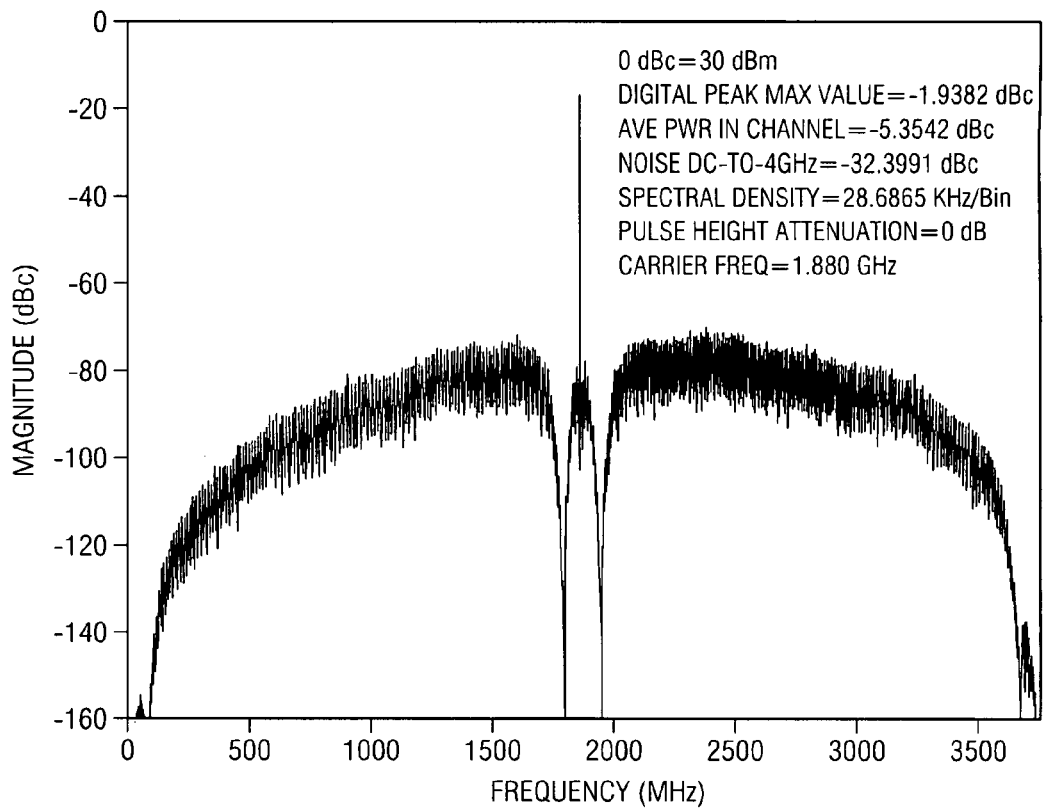
FIG. 16 is a graphical representation of exemplary spectral output from the resonator over the full measurable band.

FIG. 16 illustrates the spectral output of the resonator 306 over the full measurable band.

Figure 17:
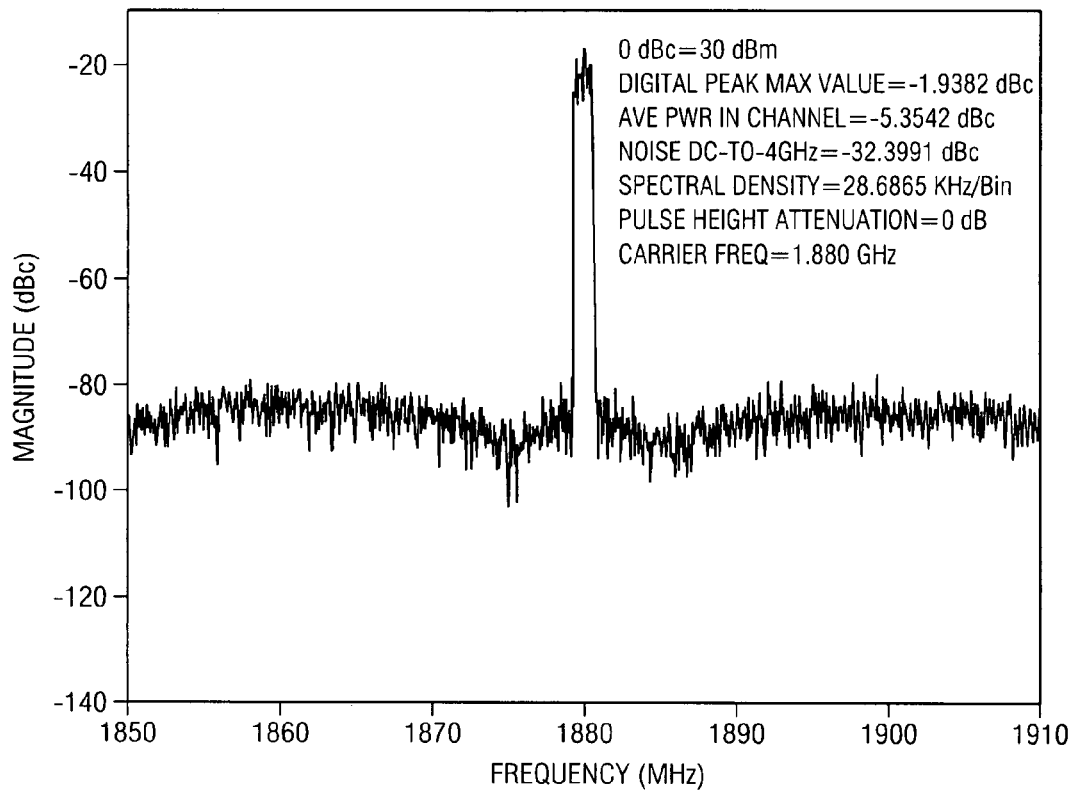
FIG. 17 is a graphical representation of exemplary spectral output from the resonator over the PCS transmit band.

FIG. 17 illustrates the spectral output of the resonator 306 over the PCS transmit band.

Figure 18:
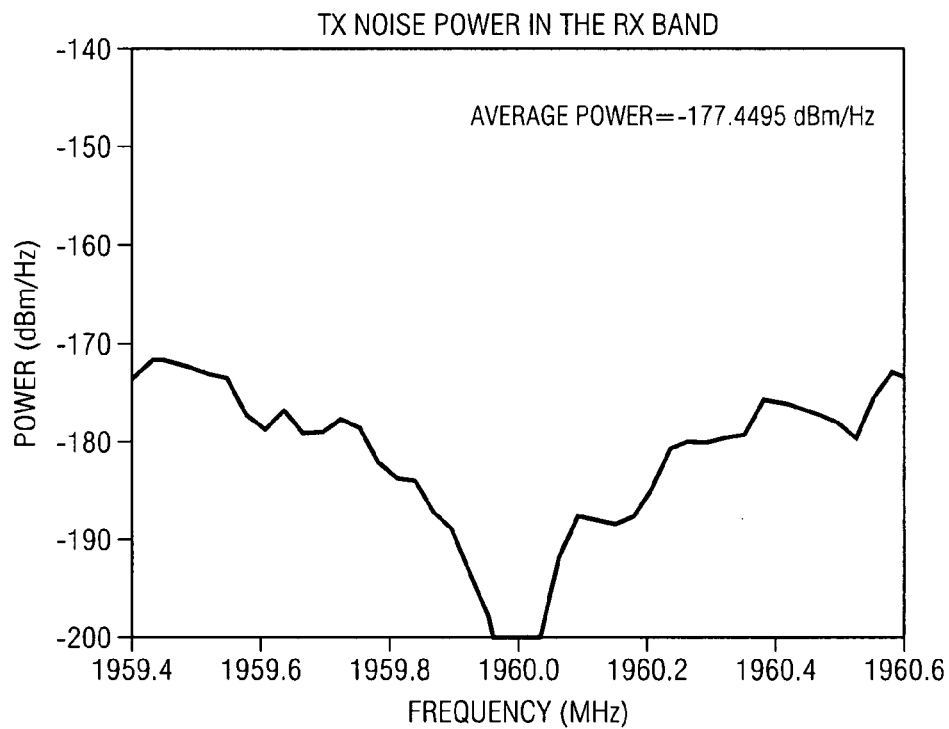
FIG. 18 is a graphical representation of exemplary transmit leakage power into the PCS receive band with an 80 MHz offset.

FIG. 18 illustrates the transmit leakage power into the PCS receive band with an 80 MHz offset.

Figure 19:
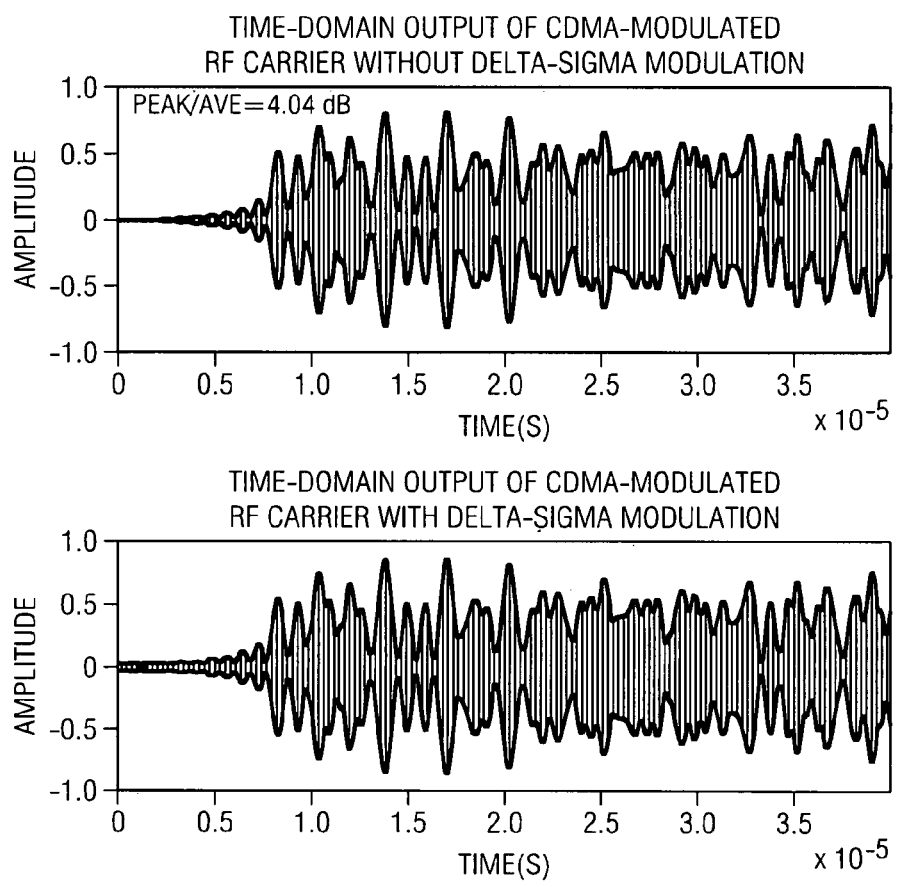
FIG. 19 is a graphical representation of exemplary time domain output from the resonator.

FIG. 19 illustrates the time domain output of the exemplary resonator 306.

Figure 20:
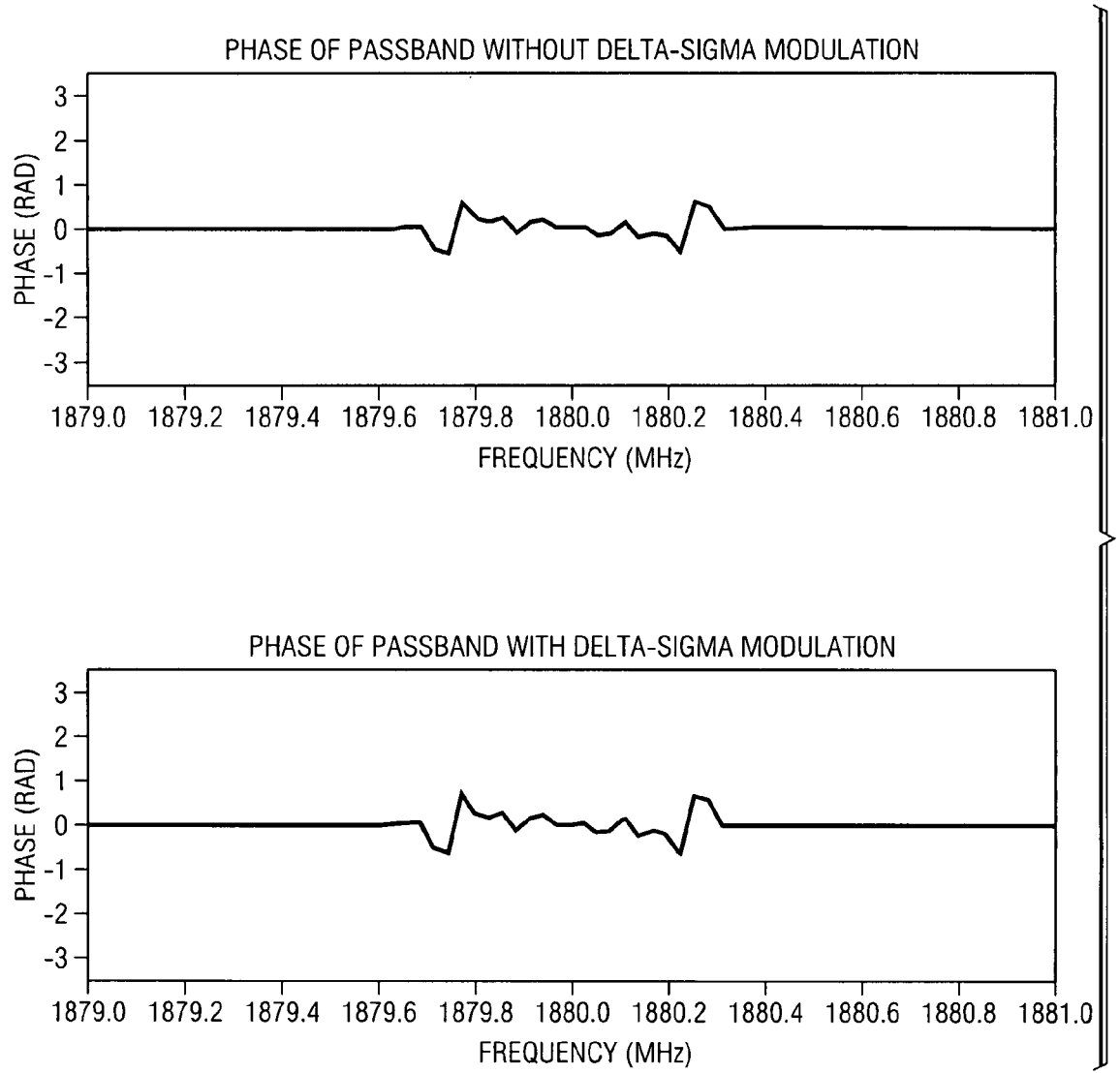
FIG. 20 is a graphical representation of exemplary phase response of an ideal case (i) without delta-sigma modulation, and (ii) with delta-sigma modulation.

FIG. 20 illustrates the phase response of an ideal case without delta-sigma modulation, and with delta-sigma modulation.

Figure 21:
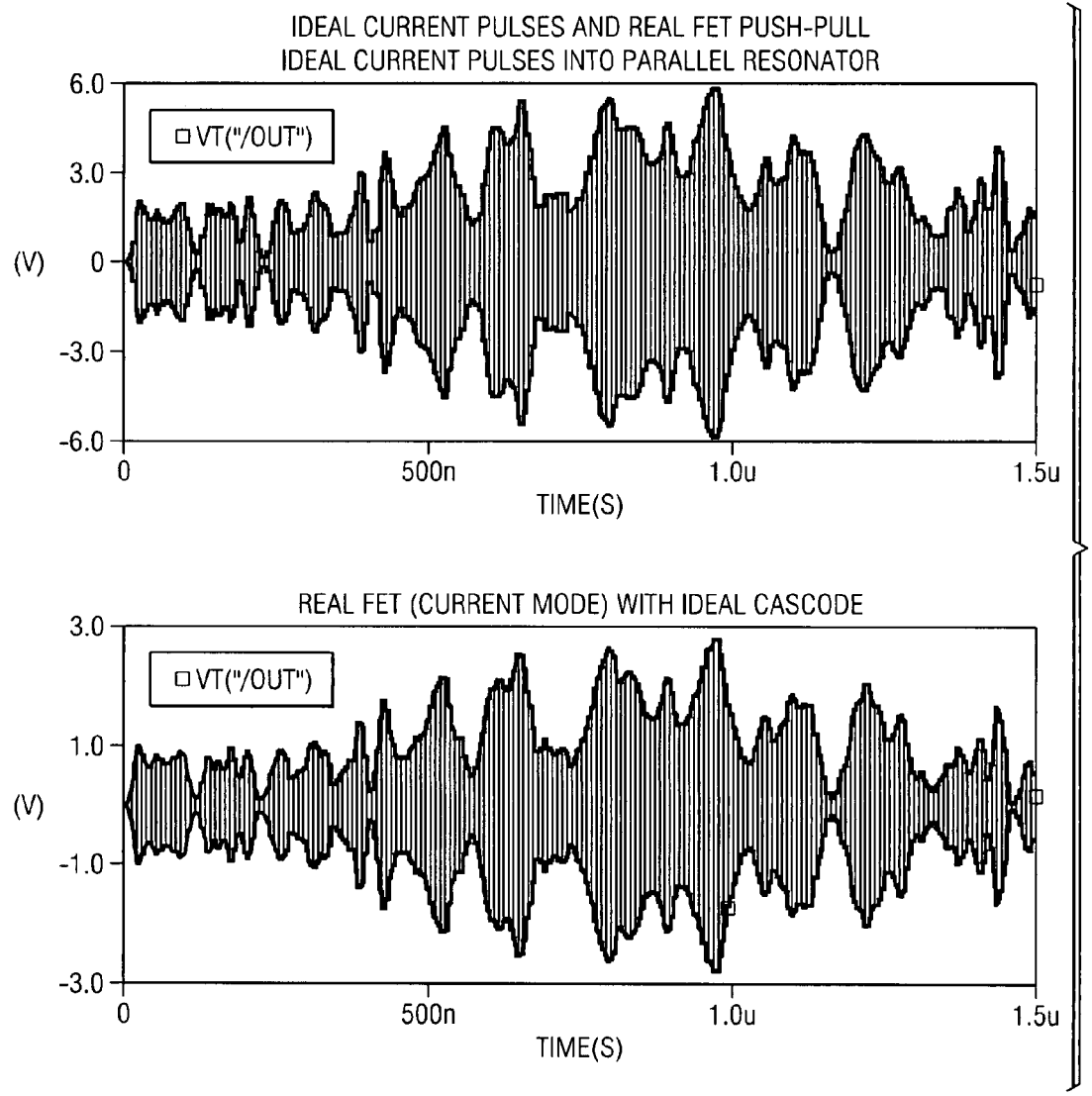
FIG. 21 is a graphical representation illustrating the difference in time domain response from simulations (generated via Cadence Design Systems, Inc. SPICE program) of the exemplary switch/resonator circuit of the invention using (i) actual production-quality GaAs MESFET models, and (ii) an ideal switch.

FIG. 21 illustrates the difference in the time domain obtained from Cadence (SPICE) simulations of the switch/resonator circuit performed by the Assignee hereof, using actual production-quality GaAs MESFET models (from a wafer foundry), as compared to an ideal switch simulation. Actual CDMA waveforms pre-processed from a MATLAB simulation of the digital processing blocks in the invention that precedes the switch/resonator interface, and the input stimulus for the switches, were imported into Cadence for simulation and analysis.

It will be recognized that while certain aspects of the invention are described in terms of a specific sequence of steps of a method or ordering of components in an apparatus adapted to implement the methodology of the invention, these descriptions are only illustrative of the broader invention, and may be modified as required by the particular application. Certain steps/components may be rendered unnecessary or optional under certain circumstances. Additionally, certain steps/components or functionality may be added to the disclosed embodiments, or the order of performance of two or more steps or components permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A resonant power converter comprising:
   a pulse input source adapted to generate a plurality of pulses;
   a resonator operatively coupled to said pulse input source and having a resonant frequency; and
   a load impedance operatively coupled to an output of said resonator;
   wherein the pulse input source comprises:
      a noise-shaping encoder capable of receiving and encoding data; and
      a charging switch capable of receiving encoded data from the noise-shaping encoder, sampling at least one of a voltage and a current of a power supply, and delivering the power supply samples to the resonator.

2. The resonant power converter of claim 1, wherein:
   the noise-shaping encoder is capable of receiving digital data at a clock rate $F_c/L_1$, where $F_c$ is a carrier frequency and $L_1$ is a multiple of the carrier frequency $F_c$; and
   the charging switch is coupled to said noise-shaping encoder, said power supply, said resonator, and a clock having a clock rate $L_2F_c$, where $L_2$ is a multiple of said carrier frequency $F_c$.

3. The resonant power converter of claim 1, wherein:
   the noise-shaping encoder is configured to suppress quantization noise at least at one frequency.

4. The resonant power converter of claim 3, wherein said noise-shaping encoder is of a first-order.

5. A method of processing a plurality of data in a radio frequency (RF) communications system, comprising:
   filtering said data; and
   encoding said data, wherein the encoding comprises:
      receiving and encoding the data using noise-shaping encoding; and
      receiving encoded data, sampling at least one of a voltage and a current of a power supply, and delivering the power supply samples to a resonator.

6. The method of claim 5, further comprising separating said data into first and second components before said filtering and encoding.

7. The method of claim 6, wherein said separating into first and second components comprises separating into I and Q components.

8. The method of claim 6, further comprising:
   quadrature modulating said encoded first and second components to form first and second modulated signals; and
   combining said first and second modulated signals.

9. The method of claim 5, further comprising quadrature modulating said filtered data before said encoding.

10. The method of claim 9, further comprising separating said data into first and second components before said filtering and modulating, and then combining said quadrature modulated and filtered signals before said encoding.

11. The resonant power converter of claim 1, wherein:
    at least one first component in the resonant power converter is adapted for data processing; and
    at least one second component in the resonant power converter is adapted for radio frequency (RF) signal generation;
    wherein said at least one first component is rendered in a first process different than a second process in which said at least one second component is rendered.

12. The resonant power converter of claim 11, wherein said first process comprises a CMOS process, and said second process comprises a Group III-V compound semiconductors process.

13. The resonant power converter of claim 11, wherein said at least one first component comprises a digital processor, and said at least one second component comprises at least one modulator and the noise-shaping encoder.

14. The resonant power converter of claim 13, wherein said at least one first component is disposed on a CMOS device, and said at least one second component is disposed on a gallium arsenide (GaAs) device.

15. The resonant power converter of claim 11, further comprising serial-to-parallel and parallel-to-serial logic between said at least one first component and at least one second component.

16. The resonant power converter of claim 1, wherein the resonator comprises a high-Q passive resonator adapted to substantially multiply the load impedance at the output of the resonator as seen by an input to the resonator.

17. The resonant power converter of claim 1, wherein the resonant power converter comprises a transmitter, and the noise-shaping encoder is adapted to distribute quantization noise substantially outside at least one frequency band associated with a receiver.

18. The resonant power converter of claim 1, wherein the noise-shaping encoder comprises:
    a plurality of low-pass encoders, the plurality of low-pass encoders capable of providing a band-pass functionality.

19. The resonant power converter of claim 1, further comprising first and second interpolators adapted to process in-phase (I) and quadrature (Q) signals, respectively, the first and second interpolators each having an interpolation ratio comprising a product of first and second parameters.

20. The resonant power converter of claim 19, wherein the first and second parameters comprise $L_1$ and $L_2$, wherein $L_1$ and $L_2$ are multiples of a carrier frequency, the interpolators further being adapted for modulation according to states other than 1,0 or −1,0.

21. The resonant power converter of claim 1, where the load impedance comprises a transmission medium adapted to transmit a plurality of radio frequency (RF) signals.

22. The resonant power converter of claim 1, wherein:
    the noise-shaping encoder is capable of receiving digital data at a clock rate $L_2F_c$, where $F_c$ is a carrier frequency and $L_2$ is a multiple of the carrier frequency $F_c$; and
    the charging switch is coupled to the noise-shaping encoder, the power supply, the resonator, and a clock having a clock rate $L_2F_c$.

23. The resonant power converter of claim 1, wherein the resonator is adapted to selectively reinforce at least portions of a plurality of the generated pulses so as to optimize an efficiency of the resonant power converter.

24. The resonant power converter of claim 2, wherein:
    the power supply has a frequency at or substantially near DC; and the load impedance is adapted to receive energy stored in the resonator.

25. The method of claim 5, wherein encoding the data comprises encoding the data such that quantization noise generated by the encoding is distributed substantially outside at least one frequency band of interest.

26. A resonant power converter, comprising:
a pulse input source capable of generating a plurality of pulses; and
a resonator coupled to the pulse input source and capable of being coupled to a load impedance;
wherein the pulse input source comprises:
   a first order noise-shaping encoder capable of receiving and encoding data and further capable of suppressing quantization noise at least at one frequency; and
   a charging switch capable of receiving encoded data from the noise-shaping encoder, sampling at least one of a voltage and a current of a power supply, and delivering the power supply samples to the resonator.

27. The resonant power converter of claim 26, wherein:
the noise-shaping encoder is capable of receiving digital data at a clock rate $F_c/L_1$, where $F_c$ is a carrier frequency and $L_1$ is a multiple of the carrier frequency $F_c$; and
the charging switch is coupled to the noise-shaping encoder, the power supply, the resonator, and a clock having a clock rate $L_2 F_c$ where $L_2$ is a multiple of the carrier frequency $F_c$.

28. The resonant power converter of claim 26, wherein:
the noise-shaping encoder is capable of receiving digital data at a clock rate $L_2 F_c$ where $F_c$ is a carrier frequency and $L_2$ is a multiple of the carrier frequency $F_c$; and
the charging switch is coupled to the noise-shaping encoder, the power supply, the resonator, and a clock having a clock rate $L_2 F_c$.

29. The resonant power converter of claim 26, further comprising first and second interpolators adapted to process in-phase (I) and quadrature (Q) signals, respectively, the first and second interpolators each having an interpolation ratio comprising a product of first and second parameters.

30. The resonant power converter of claim 29, wherein the first and second parameters comprise $L_1$ and $L_2$, wherein $L_1$ and $L_2$ are multiples of a carrier frequency, the interpolators further being adapted for modulation according to states other than 1,0 or −1,0.

* * * * *